(12) United States Patent
Liddicoat

(10) Patent No.: US 10,446,368 B2
(45) Date of Patent: *Oct. 15, 2019

(54) SYSTEMS AND METHOD FOR USING MULTIMODAL IMAGING TO DETERMINE STRUCTURE AND ATOMIC COMPOSITION OF SPECIMENS

(71) Applicant: Atomnaut Inc., Wilmington, DE (US)

(72) Inventor: Peter V. Liddicoat, Zetland (AU)

(73) Assignee: Atomnaut Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/172,609

(22) Filed: Oct. 26, 2018

(65) Prior Publication Data

US 2019/0074160 A1 Mar. 7, 2019

Related U.S. Application Data

(63) Continuation of application No. 15/322,223, filed as application No. PCT/US2015/038864 on Jul. 1, 2015, now Pat. No. 10,121,636.

(Continued)

(51) Int. Cl.
*H01J 49/00* (2006.01)
*H01J 37/285* (2006.01)
(Continued)

(52) U.S. Cl.
CPC .......... *H01J 37/285* (2013.01); *H01J 37/226* (2013.01); *H01J 49/0004* (2013.01); *H01J 49/40* (2013.01);
(Continued)

(58) Field of Classification Search
CPC .. H01J 49/00; H01J 49/02; H01J 49/04; H01J 49/40; H01J 49/0409; H01J 49/10; H01J 49/12; H01J 49/14; H01J 49/147
(Continued)

(56) References Cited

U.S. PATENT DOCUMENTS 5,061,850 A 10/1991 Kelly et al.
5,440,124 A 8/1995 Kelly et al.
(Continued)

FOREIGN PATENT DOCUMENTS

WO WO 2006101558 A2 9/2006

OTHER PUBLICATIONS

Comaniciu, et al., "Mean shift: A robust approach toward feature space analysis," Pattern Analysis and Machine Intelligence, IEEE Transactions on Pattern Analysis and Machine Intelligence, vol. 24, No. 5, pp. 603-619, May 2002.

(Continued)

*Primary Examiner* — Jason L McCormack
(74) *Attorney, Agent, or Firm* — Morgan, Lewis & Bockius LLP

(57) ABSTRACT

An imaging system that selectively alternates between a first, non-destructive imaging mode and a second, destructive imaging mode to analyze a specimen so as to determine an atomic structure and composition of the specimen is provided. The field ionization mode can be used to acquire first images of ionized atoms of an imaging gas present in a chamber having the specimen disposed therein, and the field evaporation mode can be used to acquire second images of ionized specimen atoms evaporated from a surface of the specimen with the imaging gas remaining in the chamber. The first and second image data can be analyzed in real time, during the specimen analysis, and results can be used to dynamically adjust operating parameters of the imaging system.

15 Claims, 20 Drawing Sheets

Related U.S. Application Data

(60) Provisional application No. 62/023,281, filed on Jul. 11, 2014, provisional application No. 62/019,467, filed on Jul. 1, 2014.

(51) Int. Cl.
*H01J 49/40* (2006.01)
*H01J 37/22* (2006.01)

(52) U.S. Cl.
CPC ....... *H01J 2237/04* (2013.01); *H01J 2237/05* (2013.01); *H01J 2237/2067* (2013.01); *H01J 2237/2855* (2013.01)

(58) Field of Classification Search
USPC .......................................... 250/281, 282, 288
See application file for complete search history.

(56) References Cited

U.S. PATENT DOCUMENTS

| | | | |
|---|---|---|---|
| 7,683,318 B2 | 3/2010 | Bunton et al. | |
| 8,575,544 B1 | 11/2013 | Kelly et al. | |
| 10,121,636 B2* | 11/2018 | Liddicoat | H01J 37/285 |
| 2007/0194225 A1* | 8/2007 | Zorn | B82Y 35/00 |
| | | | 250/306 |
| 2007/0205358 A1 | 9/2007 | Bunton et al. | |
| 2011/0113858 A1 | 5/2011 | Takahashi et al. | |
| 2012/0085925 A1 | 4/2012 | Kasuya et al. | |
| 2013/0264496 A1* | 10/2013 | Arai | H01J 37/06 |
| | | | 250/489 |

OTHER PUBLICATIONS

Hulett, Jr., et al., "Mass spectrometry studies of the ionization of organic molecules by low-energy positrons," Chemical Physics Letters, vol. 216, No. 1-2, pp. 236-240, Dec. 1993.

Kellogg, et al., "Pulsed-laser atom-probe field-ion microscopy," Journal of Applied Physics. 51, pp. 1184-1193, 1980.

Kristan, et al., "Online Discriminative Kernel Density Estimator With Gaussian Kernels," IEEE Transactions on Cybernetics, 44(3): pp. 355-365, 2014.

Liu, et al., "Direct Observation of atomic structures and reconstructions of silicon surfaces: A field-ion-microscope study," Physical Review Letters, 58(15): pp. 1535-1537, 1987.

Ryan, et al., "Grain boundary topography in tungsten," Philosophical Magazine, 10(106): pp. 727-729, 1964.

Supplementary European Search Report for European Application No. 15814328.9, dated Feb. 7, 2018, 3 pages.

Hu, J., et al., "Chemical sensitivity in the dissociative ionization of organic molecules by low-energy positrons," Physical Review A, 52(3): pp. 2088-2094, 1955.

Hu, J., et al., "Positron-induced dissociation of organic molecules," Physical Review A, 47(2): pp. 1023-1030, 1993.

\* cited by examiner

SYSTEMS AND METHOD FOR USING MULTIMODAL IMAGING TO DETERMINE STRUCTURE AND ATOMIC COMPOSITION OF SPECIMENS

CROSS-REFERENCE TO RELATED APPLICATIONS

This application is a continuation of U.S. patent application Ser. No. 15/322,223 entitled "Systems and Methods for Using Multimodal Imaging to Determine Structure and Atomic Composition of Specimens" filed on Dec. 27, 2016, which is a national stage entry, filed under 35 U.S.C. § 371, of International Application No. PCT/US2015/03884 entitled "Systems and Methods for Using Multimodal Imaging to Determine Structure and Atomic Composition of Specimens" filed on Jul. 1, 2015, and claims the benefit of and priority to U.S. Provisional App. No. 62/019,467 entitled "System and Method for Dynamic Integrated Multimodal Imaging and Adaptive Real Time Feature Recognition" filed Jul. 1, 2014, and U.S. Provisional App. No. 62/023,281 entitled "System and Method for Dynamic Integrated Multimodal Imaging and Adaptive Real Time Feature Recognition" filed Jul. 11, 2014, which are hereby incorporated herein by reference in their entireties.

FIELD

The present disclosure relates generally to multimodal atom probe imaging and control systems to determine structure and/or atomic composition of a specimen.

BACKGROUND

Atom probe tomography is a microscopy technique that allows specimens to be analyzed on an atomic level. During analysis, electrical pulses are typically applied to the specimen so as to stimulate the specimen in a desired manner such that specimen atoms from a surface of the specimen being imaged are ionized and evaporated and projected to a detector. Despite current advances in atom probe tomography, existing approaches can have certain disadvantages. For example, a percentage of atoms correctly identified in a specimen is typically relatively low (e.g., less than 60%). Furthermore, resolution of the detection can be insufficient for applications where high precision of atomic structure identification is required. Also, systems that provide an improved identification of atomic structure and composition are typically cumbersome, and processing time can be extended, thereby hindering application of such systems in many applications.

SUMMARY

In some aspects of the current subject matter, systems and methods are provided for dynamic integrated multimodal imaging and adaptive real time feature recognition. Such approaches can, among other possible advantages, provide alternative and improved microscope performance that may be applicable to the field of atom probe microscopes.

In one aspect, an imaging system for analyzing a specimen includes a chamber configured to retain an imaging gas therein and to receive the specimen, a detector, an energy applying component, and a controller configured to cause the energy applying component to selectively apply energy to the specimen. The selective application of energy is controlled such that the detector provides a first image of the specimen acquired in a first, non-destructive imaging mode of the imaging system, and a second image of the specimen acquired in a second, destructive imaging mode of the imaging system.

In an interrelated aspect, a method of analyzing a specimen to determine a structure and atomic composition of the specimen includes selectively alternating analysis of the specimen via a first, non-destructive imaging mode and a second, destructive imaging mode. In the first, non-destructive imaging mode, energy is applied, at a first level, to the specimen disposed in a chamber having an imaging gas retained therein such that a plurality of atoms of the imaging gas are used to acquire first image data of the specimen. In the second, destructive imaging mode, energy is applied, at a second level that is greater than the first level, to the specimen disposed in the chamber having the imaging gas retained therein such that a specimen atom of the specimen is used to acquire second image data of the specimen. The method further includes providing information on the structure and atomic composition of the specimen based on the first image data and the second image data.

In some variations, one or more of the following features can optionally be included in any feasible combination. For example, the first image and the second image can be acquired while the imaging gas is present at the chamber. The imaging system can be configured to, after the first image is acquired and before the second image is acquired, cause atoms of the imaging gas adsorbed on a tip of the specimen being imaged to desorb from the tip without being ionized.

In some implementations of the current subject matter, the energy applying component can include a laser source. The laser source can be configured to, after the first image is acquired and before the second image is acquired, cause atoms of the imaging gas adsorbed on a tip of the specimen being imaged to desorb from the tip without being ionized.

The first, non-destructive imaging mode can include applying energy to the specimen to ionize a plurality of atoms of the imaging gas, the plurality of atoms are being used by the detector to provide the first image. The second, destructive imaging mode can include applying energy to the specimen to evaporate a specimen atom from a surface of the specimen, the evaporated specimen atom being used by the detector to provide the second image.

The first, non-destructive imaging mode can include a field ionization imaging mode, and the second, destructive imaging mode can include a field evaporation imaging mode.

The detector can include first and second detectors, the first detector being configured to provide the first image acquired in the first, non-destructive imaging mode, and the second detector being configured to provide the second image acquired in the second, destructive imaging mode. The first detector can be configured to determine a three-dimensional position of at least one atom of the specimen being analyzed, and the second detector can be configured to identify the at least one atom.

In some implementations of the current subject matter, in the first, non-destructive imaging mode, the controller causes the energy applying component to apply energy to the specimen at time intervals that are greater than a rate of adsorption of atoms of the imaging gas to a surface of the specimen. In the second, destructive imaging mode, the controller causes the energy applying component to apply energy to the specimen at time intervals that are less than a rate of adsorption of atoms of the imaging gas to a surface of the specimen.

The energy applying component can be selected from the group consisting of a DC voltage source, an electrode, a laser source, and a positron source. The specimen can include at least one metal, at least one non-metal, a combination of metal and non-metal, or a biological sample.

An imaging system can further include a time of flight mass spectrometry detector configured to provide the second image of the specimen that is used to identify at least one atom of the specimen being analyzed. Alternatively or in addition, an imaging system can further include a data processing and feature recognition system configured to combine information from the first and second images to determine a position and identity of at least one atom of the specimen.

The controller can be configured to adjust parameters used in connection with causing the energy applying component to selectively apply energy to the specimen in the first, non-destructive and in the second, destructive imaging modes in response to measurements of at least one of current conditions of the specimen and current conditions of imaging environment.

A method can optionally further include, after the first image data is acquired and before the second image data is acquired, causing atoms of the imaging gas adsorbed on a tip of the specimen being imaged to desorb from the tip without being ionized. The causing of the atoms of the imaging gas adsorbed on the tip of the specimen to desorb from the tip without being ionized can include applying, at a third level that is less than the first level, energy to the specimen and increasing a temperature of at least a portion of the specimen. The method can include using the first image data to determine a three-dimensional position of at least one atom of the specimen being analyzed, and using the second image data to determine identity of the at least one atom.

In various related aspects, systems and methods and related approaches are provided for dynamic integrated multimodal imaging and adaptive real time feature recognition that provide novel and synergistic imaging, for dynamic integrated multimodal imaging and adaptive real time feature recognition that provide correlative image data from multimodal operation, for dynamic integrated multimodal imaging and adaptive real time feature recognition that provide real time recognition of features of a specimen and the imaging operation, and for dynamic integrated multimodal imaging and adaptive real time feature recognition. Such adaptive real time feature recognition can, among other possible advantages, assist in providing dynamic, integrated, programmable, reactive control of parameters for image medium formation, parameters for image medium control, and parameters of data collection.

BRIEF DESCRIPTION OF THE DRAWINGS

The current subject matter will be more fully understood from the following detailed description taken in conjunction with the accompanying drawings, in which.

When practical, similar reference numbers denote similar structures, features, or elements.

DETAILED DESCRIPTION

Figure 1:
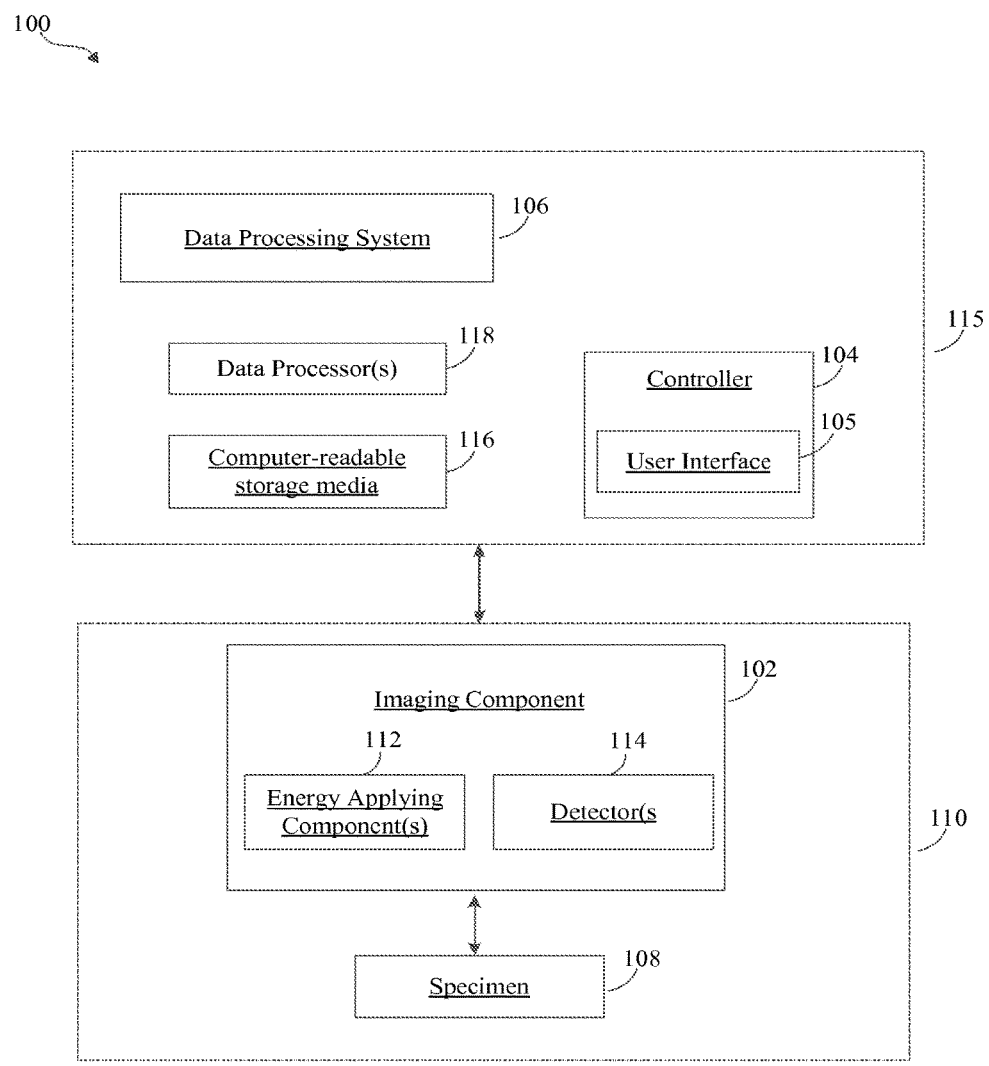
FIG. 1 is a schematic block diagram of an imaging system in accordance with the described techniques.

Certain exemplary implementations of the current subject matter will now be described to provide an overall understanding of the principles of the structure, function, manufacture, and use of the systems and methods disclosed herein. One or more examples of these embodiments are illustrated in the accompanying drawings. Those skilled in the art will understand that the systems and methods specifically described herein and illustrated in the accompanying drawings are non-limiting exemplary embodiments and that the scope of the present invention is defined solely by the claims. The features illustrated or described in connection with one exemplary implementation of the current subject matter may be combined with the features of other implementations of the current subject matter. Such modifications and variations are intended to be included within the scope of the present disclosure.

Further, in the present disclosure, like-named components of the implementations of the current subject matter generally have similar features, and thus within a particular implementations of the current subject matter each feature of each like-named component is not necessarily fully elaborated upon.

Various exemplary methods and systems for multimodal imaging of specimens using an atom probe microscopy system are provided. In general, a system uses dynamic integrated multimodal imaging to acquire data on a specimen that is analyzed to determine structure of the specimen and its atomic composition. The system can operate in two or more imaging modes which can alternate to acquire, atom-by-atom, different image data on the specimen that together can be used to ultimately provide information on a three-dimensional composition and structure of at least a portion of the specimen.

Each imaging mode involves applying energy (e.g., voltage or laser) to the specimen to cause atoms on a surface of the specimen and/or atoms of a medium surrounding the specimen to react in a desired manner. The imaging modes can be, for example, a non-destructive imaging mode which uses surrounding atoms of an imaging gas as the medium, and a destructive imaging mode which uses atoms of the specimen itself. In one example, a first imaging mode can be a field ionization mode which includes ionizing a plurality of atoms of an imaging gas surrounding the specimen such that the ionized atoms are directed towards a first, position-sensitive detector. Thus, spatial coordinates of each specimen atom can be determined using multiple imaging gas atoms. The second imaging mode can be a field evaporation mode which includes causing an atom on a surface of the specimen to be removed, or to "evaporate," from the surface and be directed to a second detector configured to determine a chemical identity of the evaporated atom. Such detector can be, for example, a time-of-flight mass spectrometry system. It should be noted that field evaporation is a probabilistic process in which pulsed energy used to stimulate a specimen atom can cause a specimen atom to field-evaporate with some likelihood or field evaporation rate. For example, there can be 0.1% to 5% likelihood that an energy pulse will evaporate an atom. For the sake of simplicity, the present disclosure refers to the probabilistic field evaporation process as "field evaporation."

Information acquired by the first and second detectors can be integrated so as to determine an identity and three-dimensional position of each atom in the specimen or a portion thereof. It should be appreciated that other imaging modes can be used as well.

The two or more imaging modes can be used to acquire images relating to the specimen while the specimen, positioned on a mount, is disposed in an imaging chamber. The imaging chamber can be configured to sealably retain therein an imaging gas that is used in the first, field ionization mode. After image data is acquired in the first, field ionization mode, the described techniques can allow the imaging gas to remain in the chamber in a manner such that the atoms of the imaging gas adsorbed on the surface of the specimen do not interfere with evaporation and detection of specimen atoms from the surface of the specimen during the second, field evaporation mode. For example, in some implementations of the current subject matter, the adsorbed atoms of the imaging gas can be caused to desorb from the surface by stimulating the specimen with energy pulses (e.g., laser pulses) of appropriate frequency. In this way, accuracy of the atomic composition of the specimen can be increased while noise can be decreased.

Systems consistent with implementations of the current subject matter can allow analyzing structure and composition of specimens with improved spatial detection resolution. Moreover, a percentage of correctly identified atoms can be increased, in some cases, up to 100%. Thus, the described techniques can allow analyzing with improved efficiency and accuracy specimens of a variety of different structure and compositions. Furthermore, the described techniques include dynamically analyzing acquired image data to adjust operating parameters used to control the imaging system based on the analysis of the image data. In this way, the imaging system can adapt to different specimen characteristic and to current conditions of the specimen and the imaging environment.

FIG. 1 illustrates schematically an exemplary imaging instrument or imaging system 100 in which the techniques for analyzing a specimen in accordance with the described subject matter can be implemented. As shown in FIG. 1, the imaging system 100 includes an imaging component 102, a controller 104 and a data processing system 106 that can communicate in a suitable manner to analyze a specimen 108. As shown in FIG. 1, the imaging component 102, which can also be referred to as an "Image Medium System," can include an imaging chamber 110 having the specimen 108 on a suitable mount (not shown in FIG. 2) disposed therein. As also shown in FIG. 1, the controller 104 and the data processing system 106 can be included in the same computing device or system 115 comprising computer-readable storage media 116 and at least one data processor 118. However, the controller 104 and the data processing system 106 can also be included in different computing devices or systems.

The imaging system 100 can optionally include any other components that are not shown herein. Thus, one or both of the controller 104 and the data processing system 106 can include or can be associated with a graphical user interface that can display acquired information about the specimen and results of the processing of the information. Furthermore, the imaging system 100 can be part of another imaging instrument or system. For example, the imaging system 100 can be included in a scanning electron microscope (SEM), a transmission electron microscope (TEM), a specimen preparation instrument (e.g., a focused ion beam (FIB) milling machine), and any other system.

The imaging chamber 110, which can have any suitable configuration, can also have an imaging gas retained therein. The imaging gas can be supplied to the imaging chamber 110 and retained in the imaging chamber 110 in a number of different ways, as are known in the art or developed in the future. In some aspects, the imaging system 100 can include a dynamic gas supply system. In such implementations, the specimen can reside in a high-pressure compartment of the imaging chamber separated by an aperture from the main volume of the imaging system 100, and the imaging gas can be delivered continuously to the high-pressure compartment. Such a configuration can advantageously allow increasing brightness of images acquired in the field ionization imaging mode, without introducing ion scattering that reduces spatial resolution.

As shown in FIG. 1, the imaging chamber 110 also has one or more energy applying components 112 configured to selectively apply energy to the specimen 108, and one or more detectors 114 configured to acquire image data relating to the specimen 108 stimulated by the energy applying component 112. It should be appreciated that the detector(s) 114 and the energy applying components 112 are shown included in the imaging chamber 110 by way of example only, as these components can be disposed at least in part outside of the imaging chamber 110.

The energy applying components 112 are configured to apply energy to the specimen 108 such that the specimen 108 is stimulated, in an alternating manner, via a first, non-destructive imaging mode of the imaging system 100 and a second, destructive imaging mode of the imaging system 100. The one or more energy applying components 112 can include one or more of constant DC voltage energy source, voltage pulses energy source, laser pulses energy source, or other types of energy sources or any combinations of energy sources. The specimen 108 can be stimulated using application of ionizing electric fields, an ionizing laser, ionizing X-rays, an ionizing electron beam, positron beam, or using any other ionization technique or a combination of ionization techniques.

The one or more detectors 114 are configured to provide first image data relating to the specimen 108 acquired in the first, non-destructive imaging mode and second image data relating to the specimen 108 acquired in the second, destructive imaging mode, as discussed in more detail below. In some implementations of the current subject matter, a single detector can be used that is both a position-sensitive detector and that is capable of determining an identity of an atom. In other implementations of the current subject matter, two or more detectors can be used. For example, the imaging system can include a first, position-sensitive detector configured to detect ionized gas atoms to determine a position of a respective specimen atom. The imaging system can also include a second detector, such as a time-of-flight mass spectrometry (TOFMS) system.

The first, non-destructive imaging mode, such as, for example, a field ionization imaging mode, can include applying energy to the specimen 108 to ionize a plurality of atoms of the imaging gas present in the imaging chamber 110 that are adsorbed on a surface of the specimen 108. In the field ionization imaging mode, a specimen atom on the surface of the specimen 108 being imaged acts as an emitting source of adsorbed imaging gas ions that are ionized and directed to a position-sensitive detector of the detectors 114. The first images of the ionized imaging gas atoms acquired by the position-sensitive detector, which are representative of the surface of the specimen and are therefore referred to herein as first images of the specimen 108, can be used to determine a position of the corresponding specimen atom.

The second, destructive imaging mode, such as, for example, a field evaporation imaging mode, can include applying energy to the specimen 108 to remove or "evaporate" a specimen atom from a surface of the specimen 108. The evaporated specimen atom can then be used by a detector of the detectors 114, such as a time-of-flight mass spectrometry (TOFMS) system, to provide second images of the specimen 108 that can be used to determine a chemical identity of the specimen atom.

In some implementations of the current subject matter, the specimen can be imaged in both the field ionization and field evaporation imaging modes while an imaging gas is present in the chamber 110. Although the presence of the imaging gas would typically interfere with accurate detection of identity of specimen atoms (e.g., due to the possibility of atoms of the imaging gas being detected in addition to ionized and evaporated specimen atoms), the described techniques allow avoiding undesirable effects from the presence of the imaging gas during the field evaporation imaging mode. Specifically, atoms and molecules of the imaging gas adsorbed on the surface of the specimen can be removed, or desorbed, from the surface prior to, and maintained during, a specimen atom being evaporated during the field evaporation imaging mode. Prior to field-evaporation, this can be achieved by, for example, applying energy pulses of a strength sufficient to stimulate desorption but not gas or specimen ionization, and having an appropriate frequency to inhibit re-adsorption, to the specimen so as to remove adsorbed atoms or molecules of the imaging gas from the specimen surface. During field-evaporation, it can be maintained by, for example, applying energy pulses of a strength sufficient to stimulate desorption and specimen ionization, and having an appropriate frequency to inhibit re-adsorption, to the specimen so as to prevent imaging gas adsorption to the specimen surface. In some aspects, to desorb imaging gas from the surface of the specimen, at least a portion of the specimen can be subjected to an increased temperature.

The parameters of the energy pulses for avoiding interference can depend upon imaging environment conditions. Such imaging environment conditions include, but are not limited to, the temperature, size, voltage-bias and composition of the specimen, the temperature, composition and pressure of the imaging gas, and the type of the energy pulse delivered. If the delivered energy is laser energy, the type of energy can be described by such parameters as a wavelength, spot size, repetition frequency, and energy. As an example, to avoid imaging gas interference for field-evaporation of a specimen of tungsten at 18 Kelvin with a 60 nm radius apex in an imaging gas atmosphere of helium at $2 \times 10^{-8}$ Torr held at 3.7 kV, and using laser energy pulses of wavelength 355 nm, repetition rate 250 kHz, and spot size 3 µm, prior to field-evaporation one or more pulses at energy 50 picojoules (pJ) will desorb gas atoms, and pulses at 200 pJ during would permit specimen atom evaporation.

The parameters relating to desorption of imaging gas from the surface of the specimen can be set in a number of different ways. In some aspects, desorption energy can be set or defined as a fraction of the pulse energy at the beginning of the specimen analysis, which can be done manually (e.g., based on user input) or automatically. For example, if laser energy is being used, the laser pulse energy can be defined as 200 pJ/pulse, and a 'desorption pulse fraction' can be defined as 25% of the laser pulse energy, that is 50 pJ/pulse. The parameters describing the desorption energy can be modified during the specimen analysis, for example, based on feedback relating to various aspects of the specimen analysis acquired during the analysis, in accordance with a certain predefined way, or in any other manner.

Referring back to FIG. 1, the imaging component 102 can receive control signals including parameters for controlling operation of the imaging component 102 (which can also be referred to as "mediums for imaging"). The parameters can include one or more parameters of operation of the energy applying components 112 which can be in the form of various voltage patterns, laser patterns, or other types of patterns. For example, the imaging component 102 can be continuously provided with static parameters. The imaging component 102 can also be provided with programmed regular pulse patterns, programmed irregular pulse patterns, and/or a combination of programmed regular or irregular pulse patterns. The parameters can be provided and adjusted in manners which are adaptive to characteristics of the imaging component 102, including a current condition of the specimen and current state of components of the imaging component 102. Such characteristics can be determined separately or as a combination of information provided by the data processing system 106 and data provided by the controller 104.

The imaging component 102 can include one or more specific hardware processing apparatuses or devices for performing the communication, storage, interpretation, and control operations. The imaging component 102 can be configured to execute specific software processing methods for performing the communication, storage, interpretation, and control operations.

The controller 104, which can also be referred to as an "Image Medium System," can control operation of the energy applying components 112 and other components of the imaging component 102 based on measurements of the conditions of the specimen 108 being analyzed and/or other factors.

The data processing system 106, which can also be referred to as a "Data Processing and Feature Recognition System," is configured to communicate with the imaging component 102 and the controller 104. The data processing system 106 can receive image data acquired by the imaging component 102 and process the image data. For example, the first images of the specimen 108 acquired in the field ionization imaging mode and the first images of the specimen 108 acquired in the field evaporation imaging mode can be used to determine a position and identity of each specimen atom being analyzed, to thus determine atomic structure and composition of at least a portion of the specimen 108.

The data processing system 106 can also be configured to communicate with the controller 104 to provide to the controller 104 information acquired based on the processing of the image data which can be used by the controller 104 to control operation of the imaging component 102. For example, information provided by the data processing system 106 based on the image processing can be used to adjust one or more parameters used by the controller 104.

As shown in FIG. 1, the computing system 115 that is part of or is associated with the imaging system 100 can include the data processing system 106 and the controller 104. The computing system 115 can include computer-readable storage media 116 storing computer-executable instructions and one or more data processor(s) 118 communicatively coupled to the computer-readable storage media 116. It should be appreciated that the data processing system 106 and the controller 104 are shown included in the same computing system 115 by way of example only, as the data processing system 106 and the controller 104 can be included in different computing devices or system and each of the data processing system 106 and the controller 104 can be, can include, or can be associated with respective computer-readable storage media one or more data processor(s).

The data processor(s) 118 can be configured to access the computer-executable instructions stored in the computer-readable storage media 116 and execute the computer-executable instructions to perform analysis of image data acquired by the imaging component 102. For example, the data processor(s) 118 can execute the computer-executable instructions to communicate, store, process, and interpret data, and recognize information. In some aspects, image data communicated to the data processing system 106 by the imaging component 102 in real time, during analysis of the specimen 108, can have primitive or no processing performed thereon, and can therefore be referred to as "raw" image data. A subset or the entire transited image data can be processed by the data processing system 106 in order to filter and prepare the data for subsequent interpretation. The data processing system 106 can process and acquired image data and it can convert the image data into information to be communicated to the controller 104 and information to be communicated to imaging component 102.

The data processor(s) 118 can execute the computer-executable instructions stored in the computer-readable storage media 116 to execute various data processing and feature recognition algorithms on the acquired image data to determine atomic structure and composition of the specimen. The data processing system 106 can interpret the image data using appropriate feature recognition algorithm(s) in order to convert the data to information into features characteristic of the specimen 108 and/or other components of the imaging component 102. The data processing system 106 can use any number or combination of algorithms to incrementally build generative feature recognition of data in real time.

The imaging system 100 can operate in a voltage stimulated field ionization imaging mode, and the data processing system 106 can employ a multidimensional online adaptive kernel density estimation algorithm for data processing and/or feature recognition, for example, as described in Kristan, M. and A. Leonardis, Online Discriminative Kernel Density Estimator With Gaussian Kernels. IEEE Transactions on Cybernetics, 2014. 44(3): pp. 355-365. The kernel can be, for example, Gaussian, Epanechnikov, quartic, or t-distribution based. The data processing system 106 can execute data processing and feature recognition algorithms including an online discriminative adaptive kernel density estimation algorithm. Image data acquired via a field-ionization imaging mode can be processed in real time, as this data is received by the data processing system 106, using an online kernel density estimation algorithm, a mean-shift algorithm for data processing and/or feature recognition, as described in Comaniciu, D. and P. Meer, Mean shift: A robust approach toward feature space analysis. Pattern Analysis and Machine Intelligence, IEEE Transactions on Pattern Analysis and Machine Intelligence, 2002. 24(5): pp. 603-619. Any other suitable computational technique(s) can be used additionally or alternatively.

The imaging system 100 can operate in a voltage stimulated field ionization imaging mode, and the data processing system 106 can perform identification of specimen features or imaging mode using one or more of the following types of analyses of the image data acquired by the detector(s): determining ion density modes in the distribution of ions detected across the imaging field of view, recognizing patterns in the density distribution of ions detected across the imaging field of view, determining the dynamic nature over time of ion density characteristics, and determining the dynamic response of ion density characteristics to changes in imaging mode parameters.

The data processing system 106 can perform identification of specimen features by determining a number of specimen atoms currently visible, distribution characteristics of the atoms, detector coordinates of the atoms, reconstructed coordinates of the atoms, elemental identities of the atoms, and rate of removal of atoms when the imaging system operates in a field evaporation imaging mode. Regardless of the specific computational approach utilized, the data processing system 106 can discard selected source (or raw) image data acquired by the detector(s). Alternatively, the raw image data can be stored at least in part on any suitable storage medium.

The data processing system 106 can use any number or combination of data processing techniques as part of data interpretation or to prepare data for interpretation. The data processing techniques to prepare the data for interpretation can include detection of feature modes within discrete or continuous data distributions. Such technique can be used, for example, when analyzing imaging ion data acquired using the field ionization imaging mode. The data processing techniques to prepare the data for interpretation can also include background subtraction to equalize systematic inhomogeneous signal distributions. Such techniques can be used, for example, when analyzing imaging ion data acquired using the field ionization imaging mode and when a number density distribution of imaging gas ions for imaging specimen atoms is inhomogeneous due to inhomogeneous electric field strengths across a surface of the specimen. The inhomogeneous electric field strengths may result, for example, from a crystalline specimen material. For example, the crystalline material can be a material where a directional density of atoms changes depending on orientation angle of the crystal lattice, such as in face-centered cubic metal (e.g., a crystal atomic lattice spacing of a direction in-face centered cubic aluminum is nominally 0.2338 nm, compared to the crystal atomic lattice spacing of a direction in-face centered cubic aluminum which is nominally 0.2025 nm).

The data processing system 106 can include one or more specific hardware processing apparatuses or devices for performing the communication, storage, interpretation, and control operations. The data processing system 106 can be configured to execute specific software processing methods for performing the communication, storage, interpretation, and control operations. Also, the data processing system 106 can include software configured to be executed by at least one processor (e.g., data processors 118).

The controller 104 can be or can be included in a computing device, or a programmable computer. In the illustrated example, the controller 104 can be included in the computing device 115. The controller 104 can also be a separate computing device having one or more data processors and one or more computer-readable storage media. The controller 104 can be configured to perform various operations, such as, for example, to receive, transmit, store, and interpret information, and control operation of one or more components of the imaging system 100, such as, for example, the imaging component 102 and the data processing system 106. The controller 104 can be configured to interpret data and information communicated by the data processing system 106 and data communicated by the imaging component 102. The controller 104 can be configured to interpret its sources of stored data, program operation instructions, and real time data and information to provide dynamic integrated and adaptive control of the parameters for operation of the imaging component 102 and the data processing system 106. The interpreted information and data can be displayed on a suitable graphical user interface, such as a graphical user interface 105 that can be included in the controller 104, as shown in FIG. 1, or that can be otherwise associated with the controller 104. Additionally or alternatively, the information and data can be stored in a suitable manner on one or more suitable storage media.

The controller 104 can be configured to receive user input and allows a user to monitor and control operation of other components of the imaging system 100. The user interface 105 can offer a user programmability and operational control of operation variables for the imaging system, including but not limited to the controller 104, the imaging component 102, and the data processing system 106. Thus, the user interface 105 can receive user input including operating parameters for control of operation of the imaging system to acquire images of the specimen, parameters relating to operation of the data processing system 106, and any other information. The user interface 105 can also display various information, including information acquired during analysis of the specimen. Although the user interface 105 is shown as part of the controller 104, it can be a different user interface.

The imaging component 102 can operate in field ionization and field evaporation imaging modes and the data processing system 106 can perform a combination of background subtraction, online adaptive kernel density estimation, mean-shift clustering and other processing. Imaging data acquired in the field ionization and field evaporation imaging modes can be processed and features can be extracted from the data to determine, among other parameters, a rate of evaporation of specimen atoms. The controller 104 can compare an evaporation rate setting that can be set based on a user input to one or more features of the determined rate of evaporation of specimen atoms.

This information can then be interpreted in context with other operational parameters and programming, and it can be provided as an appropriate adaptive response for given circumstances to the controller 104, the imaging component 102, and the data processing system 106.

The controller 104 can include one or more specific hardware processing apparatus for performing the communication, storage, interpretation, and control operations. The controller 104 can be configured to execute specific software processing methods for performing the communication, storage, interpretation, and control operations.

Figure 2:
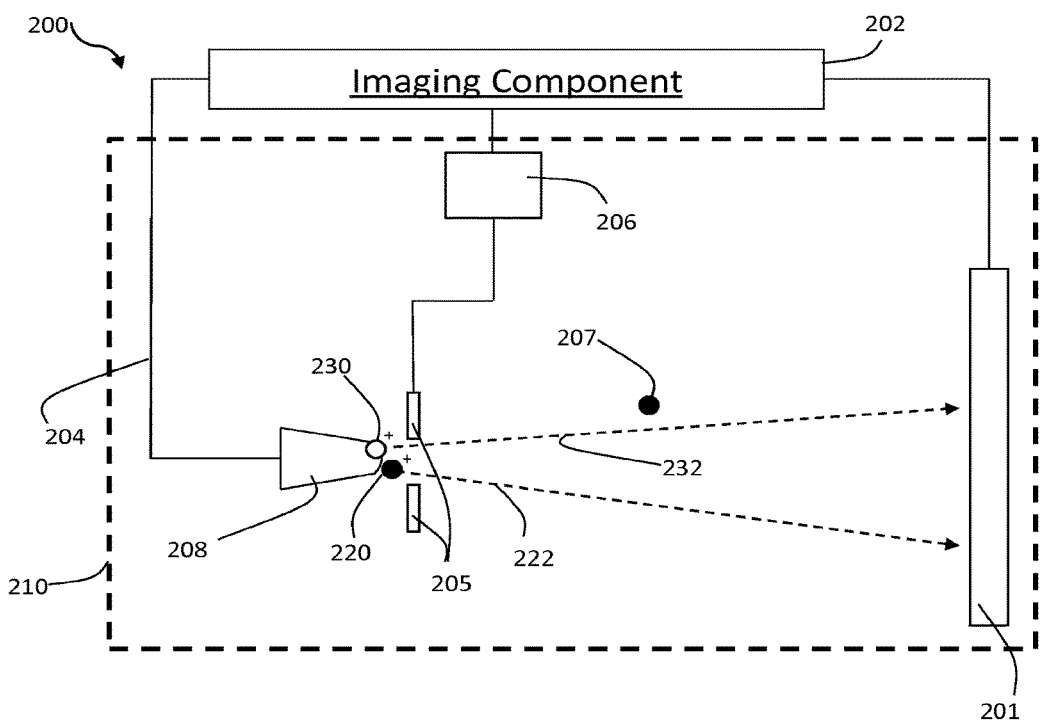
FIG. 2 is a schematic diagram illustrating an example of an imaging component of an imaging system in accordance with the described techniques.

FIG. 2 illustrates an example of an imaging component 202 of an imaging system 200 in accordance with some implementations of the current subject matter (e.g., imaging system 100 shown in FIG. 1). The imaging component 202 includes an imaging chamber 210 having a specimen 208 disposed therein. The specimen 208 can be mounted on a specimen stage or mount (not shown).

The imaging chamber 210 can be filled with an imaging gas 207 in the form of atoms or molecules, collectively referred to hereinbelow as "atoms." During operation of the imaging system 200 in the field evaporation imaging mode, the imaging chamber 210 can have a pressure in a range from $10^{-3}$ Torr to $10^{-12}$ Torr maintained therein in a controlled manner.

The imaging component 202 also includes an electrical control line 204 configured to deliver voltage to the specimen 208, a voltage source 206 configured to deliver voltage to a counter electrode 205, and a detector 201. The counter electrode 205 can be configured for continuous or pulsed voltage bias.

The imaging component 202 is configured to operate in multiple imaging modes such that it can alternate between operating in a field ionization imaging mode and operating in a field evaporation imaging mode. As schematically shown in FIG. 2, in this example, a voltage can be applied to the specimen 208 via the electrical control line 204. A voltage from the voltage source 206 can be applied to a counter electrode 205. The voltage from the voltage source 206 applied to the counter electrode 205 can be continuous (DC) and/or pulsed. Similarly, the voltage applied to the specimen 208 via the electrical control line 204 can be continuous (DC) and/or pulsed. The voltages from one or more sources can be applied to the specimen 208 in accordance with parameters that can be set in various manners, including based on user input and/or automatically. The parameters can be set so as to control operation of the imaging component 202 in various imaging modes, including controlling the way in which the imaging modes alternate. It should be appreciated that the specimen 208 in the example of FIG. 2 can be stimulated using voltages from the electrical control line 204 and the voltage source 206 by way of example only, as energy can be delivered to the specimen from one or more of various types of sources.

In some implementations of the current subject matter, the imaging system 202 can include an electrode that allow focusing a trajectory of ions repelled from a surface of the analyzed specimen. Such an electrode can provide focusing so as to capture a wider field of view. This can be achieved by using the electrode as a focusing charged particle lens and by application of a constant, time-varying, or pulsed voltage. One or more electrodes may be used to achieve optimal focusing qualities for spatial imaging and/or spectrometry. A focusing electrode, which can be movable, can be placed in front of, behind the tip of the specimen, or in other orientation with respect to the tip of the specimen. In such an arrangement, a field of view up to about 180 degrees may be achieved. In some aspects, the field of view can be from about 80 degrees to about 120 degrees. The electrode may be movable. Focusing may be tuned by moving an electrode or electrode(s) to optimal locations for a given specimen.

The voltages from the voltage source 206 and the electrical control line 204 can be applied to the specimen 208 so as to stimulate atoms of the imaging gas 207 to field ionize such that resulting ionized atoms 220 are projected to a detector 201, as schematically shown by a line 222 in FIG. 2. As also shown in FIG. 2, the voltages can also be applied to the specimen 208 so as to stimulate specimen atoms of 230 disposed on a tip of the specimen 208 to field evaporate and to be then projected to the detector 201, as schematically shown by a line 232. A voltage difference can be present between the specimen 208 and the counter electrode 205, as well as between the specimen 208 and the detector 201 that can provide projection of ions and can include applying a voltage at or in the vicinity of the detector 201.

The specimen 208 (e.g., specimen 108 in FIG. 1) can include a variety of different materials. The specimen 208 interacts with an image medium, such as the imaging gas 207, or it is stimulated to produce an image medium in the form of specimen atoms that can be sensed by the detector 201. The specimen 208 can include one or more metals or non-metals, such as, for example, ceramics, plastics, or organic material. The specimen 208 can be a biological sample which can be in the vitrified form—e.g., embedded into vitreous ice or other medium. Furthermore, the specimen 208 can in the form of one or more types of various structural forms, non-limiting examples of which include porous, molecular, consolidated, composite, layered structures or any other types of structures.

The specimen 208 can be prepared for imaging by using any number of any suitable specimen preparation procedures. The specimen can be a section that is removed from a specific site of an object of interest.

The specimen 208 can have any suitable size appropriate for characterization by a selected imaging mode or configuration. For example, the specimen 208 can be prepared such that it can be needle-shaped with an apex or tip being imaged having a diameter in a range from 10 nm to 500 nm. In some aspects, the tip of the specimen can have a diameter in a range from about 10 nm to about 200 nm.

As mentioned above, the specimen can be shaped as a needle and a tip of the specimen is a surface being imaged. In some implementations, after the imaging system commences to operate in the field evaporation imaging mode, the tip of the specimen apex can assume an approximately spherical shape, due to the manner in which specimen atoms are being removed via field evaporation. It should be appreciated that the shape of the tip can be approximately spherical but that it can deviate from an ideal sphere. Such shape of the tip can facilitate the tip's acting as a magnification lens such that, when atoms (either specimen atoms in the field evaporation mode or atoms of an imaging gas in the field ionization mode) are ionized, they are electrically repelled and projected outwards from the biased specimen tip. This can advantageously create a magnification of approximately ×1,000,000 to ×10,000,000, which can improve accuracy and efficiency of specimen analysis.

Non-limiting examples of the imaging gas 207 can include a single high purity single species gas such as, for example, helium, neon, argon, or hydrogen. The imaging gas 207 can be supplied to the specimen 208 in a pressure range from $10^{-3}$ Torr to $10^{-12}$. The imaging gas 207 can also include a mixture of high purity single species gases such as, for example, a mixture of two or more of helium, neon, argon, or hydrogen. Such imaging gas mixtures can be utilized to achieve synergistic imaging results. For example, use of a mixture of hydrogen and helium, where hydrogen concentration can be in a range from 1% to 10% and helium concentration can be in a range from 90% to 99%, can result in desirable and different imaging characteristics; such a change in imaging characteristics can be produced by hydrogen-promoted helium ionization.

In some implementations of the current subject matter, the imaging system 100 can use a single high-purity gas or a mixture of high-purity gases to assist in field evaporation of the specimen 108. In such embodiments, the process of assisted field evaporation can be used one or more times in the same or different configurations of the imaging system 100 to condition a shape or surface-chemistry of the specimen before subsequent imaging. For example, a hydrogen-helium gas mixture, where hydrogen concentration can be in a range from 1% to 10% and helium concentration can be in a range from 90% to 99%, can be used to assist field evaporation of an iron-based specimen, followed by field evaporation assisted by a second gas such (e.g., high purity helium), and then followed by field ionization imaging using high-purity helium as the imaging gas.

In the example of FIG. 2, a positive DC voltage bias can be applied to the specimen 208 via the control line 204 at an amplitude that depends on a desired manner of field ionization or field evaporation, frequent negative voltage bias pulses can be supplied from the voltage source 206 to the counter electrode 205 at an amplitude appropriate to stimulate a desired manner of field ionization, and infrequent negative voltage pulses can be supplied from the voltage source 206 to the counter electrode 205 at an amplitude appropriate to stimulate desired field evaporation of atoms or molecules of the specimen 208. This can be carried out in a manner to achieve a desired quantity of field ionization data before field incrementing a depth characterization of the specimen 208 by field evaporation.

In some aspects, a certain number of voltage pulses can be applied to the specimen in the field ionization mode, and a different number of pulses can be applied to the specimen in the field evaporation mode. For example, 1000 pulses can be applied to the specimen in the field ionization mode and 10 pulses can be applied to the specimen in the field evaporation mode. It should be appreciated, however, that any other suitable number of pulses can be applied additionally or alternatively, including different number of pulses at each iteration of a specimen imaging process. Other forms of energy (e.g., continuous voltage or continuous laser beam) can be applied as well.

The detector 201 can be configured to ascertain information upon mass of atomic or molecular ions produced in an imaging mode. The detector 201 can be any suitable type of a position-sensitive detector. Non-limiting examples of the detectors include a superconducting detector that is sensitive to kinetic energy (e.g., a niobium nitride superconducting detector). The non-limiting examples of the detectors also include a multichannel plate with delay-lines, and a silicon semiconductor charged particle detector. Non-limiting uses of the detector to determine the mass of atomic or molecular ions include time-of-flight mass spectrometry and kinetic energy mass resolution.

In some aspects, the detector 201 can be associated with three meshes installed planar and parallel in front of the detector 201 and operated so as to determine the energy distribution of ions originating from or near the specimen 208. For example, by applying a voltage to the center mesh and fixing the ground level on the other two meshes, information for the energy distribution of ions can be obtained.

An imaging system (e.g., imaging system 100 of FIG. 1) including the imaging component 202 can also perform feedback processing such that information acquired during operation of the system can be used to control and/or adjust subsequent operation of the imaging component 202. For example, image information acquired by the at least one detector 201 in one or more imaging modes, as well as information relating to characteristics of the specimen, current conditions of the specimen and/or environment around the specimen can be processed and used to control, via a controller (e.g., controller 104 in FIG. 1), operation of the imaging component 202.

A suitable computing device (e.g., data processing system 106 in FIG. 1 or a computing device including the data processing system 106) can process and analyze information acquired during operation of the imaging system and the results can be used to control, via a controller (e.g., controller 104 in FIG. 1), operation of components of the imaging system. For example, the computing device can recognize features within the imaging mode data and/or specimen imaging data and provide information on these features to the controller for interpretation and control of operating parameters of the imaging component 202. This feedback loop may be executed in a programmed manner and repeated a suitable number of times. For example, the feedback processing can be performed periodically or continuously during specimen analysis.

Figure 3:
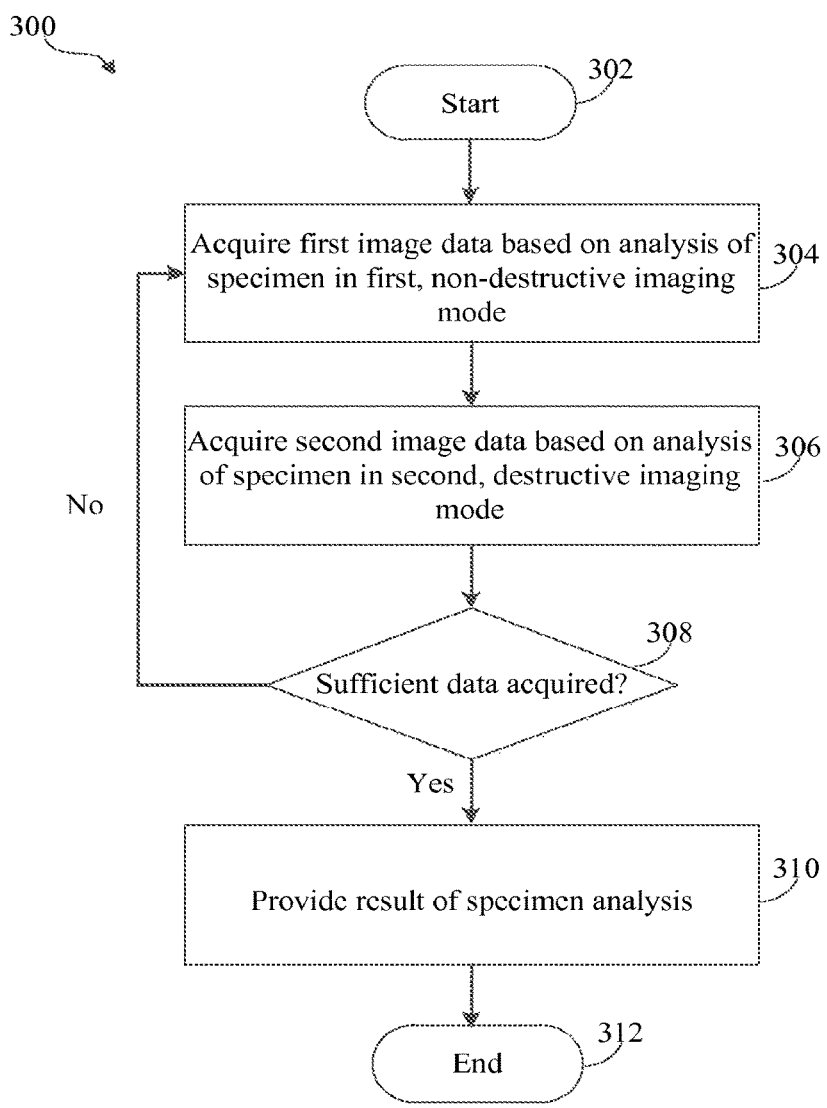
FIG. 3 is a flowchart illustrating a process of analysis of a specimen using the described techniques.

FIG. 3 illustrates an exemplary process 300 of analyzing a specimen to determine a structure and atomic composition of the specimen. As shown in FIG. 3, the process 300 can start at block 302 at any suitable time, for example, when an imaging system or instrument (e.g., imaging system 100 in FIG. 1) is activated upon a suitable trigger. The specimen can be any suitable type of a specimen, such as specimen 108 (FIG. 1) or specimen 208 (FIG. 2). The specimen can be disposed in a chamber (e.g., chamber 110 or 210) having an imaging gas retained therein.

Regardless of the specific way in which the process 300 starts, the process 300 can then follow to block 304 where energy can be applied to the specimen to analyse the specimen in a first, non-destructive imaging mode. The first, non-destructive imaging mode can be a field ionization imaging mode. In the first mode, atoms of the imaging gas disposed in the chamber with the specimen can be ionized and directed to a detector (e.g., detector 114 or detector 201) which can be any suitable position-sensitive detector. The detector can acquire first image data of the ionized imaging gas atoms. The field ionization imaging mode is used to image the surface of the specimen in a manner such that multiple ionized atoms (ions) of the imaging gas represent a location of each specimen atom. In this way, the use of multiple gas atoms used for imaging the specimen can provide an improved accuracy of detection of a position of a corresponding specimen atom.

As shown in FIG. 3, the process can then proceed to block 306 where energy can be applied to the specimen to analyse the specimen in a second, destructive imaging mode. The second, destructive imaging mode can be a field evaporation imaging mode. In the second mode, atoms of the specimen can be ionized and removed, or evaporated from a surface of the specimen. The field evaporation process can be performed atom-by-atom such that a single atom is removed at each iteration of the process 300 at a block 306. However, more than one atom can be evaporated at a time. During the field evaporation mode, which alternates with the field ionization mode, layers of specimen atoms are successively removed from the surface of specimen so as to enable visualization of a sub-surface structure of the specimen. In this way, the field evaporation can be used to investigate the depth of the specimen to ultimately determine an atomic structure of the specimen.

The evaporated atom is directed to a detector (e.g., detector 114 or detector 201) which can be any suitable detector configured to detect chemical identity of atoms. The detector detecting the evaporated atom in the field evaporation imaging mode can be the same as the detector that detects ionized gas atoms in the field ionization imaging mode. Alternatively, a different detector can be used in the field evaporation imaging mode to detect the evaporated specimen atom. Any suitable detector such as, for example, time-of-flight mass spectrometry detector, can be used to acquire second image of the evaporated specimen atom.

The imaging of the specimen in the field evaporation imaging mode can be performed with the imaging gas used during the field ionization imaging mode present in the imaging camera. To avoid noise that would result from detection of imaging gas ions during the field evaporation imaging mode, the described techniques involve desorption of gas atoms from the surface of the specimen without substantial ionization thereof. In other words, the probability of ionizing the gas atoms being desorbed is greatly reduced such that, even if a small percentage of imaging gas atoms remains on the tip of the specimen, the amount of such atoms is not sufficient to cause undesirable noise during detection of the evaporated specimen atom. For example, laser pulses of sufficient repetition frequency and energy can be applied to the specimen to thermally desorb gas atoms from the specimen. The frequency of the laser pulsed needs to be high enough such that, between pulses, gas atoms do not have enough time to repopulate the surface of the specimen. In this way, a "clean" specimen tip for field evaporation can be created despite being in an atmosphere with gas. When a subsequent laser pulse with sufficient energy for field evaporation is applied to the tip the specimen, a specimen atom will field evaporate and will be sent to the detector, without any gas ions being sent to the detector.

Atoms detected by one or more suitable detectors in field ionization and field evaporation imaging modes can be acquired digitally. The analysis of the specimen at blocks 304 and 306 can include processing of the respective first and second image data. As a result of the processing, various information, including information that can be used to control subsequent operation of the imaging system during specimen analysis, can be obtained, as shown in more detail in FIG. 4.

After the first and second image data is acquired at blocks 304, 306, the process 300 can follow to a decision block 308 where it can be determined whether sufficient amount of data relating to the specimen being analyzed has been acquired. This can be determined in a number of different ways. For example, as discussed in more details below, it can be determined that sufficient amount of data is acquired when the specimen has been analyzed to a sufficient depth. The amount of data required to determine atomic composition and structure of the specimen can vary depending on properties of the specimen, a particular application, characteristics of the imaging instrument being used, and any other factors. Operation of the imaging instrument and conditions of the specimen can be monitored via a suitable controller and/or based on user input, and it can be dynamically determined either automatically or based on user input whether sufficient amount of data relating to the specimen has been acquired. In some implementations, the processing at decision block 308 can determine whether a certain number of iterations of the process 300 in each of the field ionization and field evaporation imaging modes has been reached. The number of iterations can be set prior to analyzing the specimen or can be dynamically determined as the specimen is being analyzed.

The processing at blocks 304-308 can be repeated a plurality of times such that analysis of the specimen selectively alternates via the field ionization and field evaporation modes until atomic composition and structure of the specimen is determined. If it is determined, at decision block 308, that sufficient amount of data has not been yet acquired, the process 300 can branch back to the block 304 to apply energy to the specimen in the first, non-destructive imaging mode, such as the field ionization mode. Analysis of the first image data acquired in the field ionization mode following acquisition of the second image data in the field evaporation mode (e.g., when the process 300 reforms to block 304) allows determining, based on changes in the current second image data relative to previously acquired second image data, which atom has been evaporated in the preceding field evaporation mode. Because the identity of the evaporated atom has been determined, both position and identity of the atom of the specimen can be determined. The analysis of the specimen at block 304 is followed by analysis at block 306 at which another atom is evaporated from the surface of the specimen and directed to a detector.

If it is determined, at decision block 308, that sufficient amount of data has been acquired, the process 300 can continue to block 310 where results of the specimen analysis can be provided. A final result representing information on the structure and atomic composition of the specimen can be provided at block 310. The result can be provided in any suitable format—e.g., as graphical, textual, or any other type of data or combination of various types of data. The result can be displayed on a user interface, stored, transmitted to a remote computing device, or otherwise presented or used. Also, because the first and second image data are analyzed dynamically, as the specimen is being analyzed, results of the specimen analysis can be provided at any time during specimen analysis. The process 300 can end at a suitable time at block 312 (e.g., when the analysis of the specimen is completed), as shown in FIG. 3.

Figure 4:
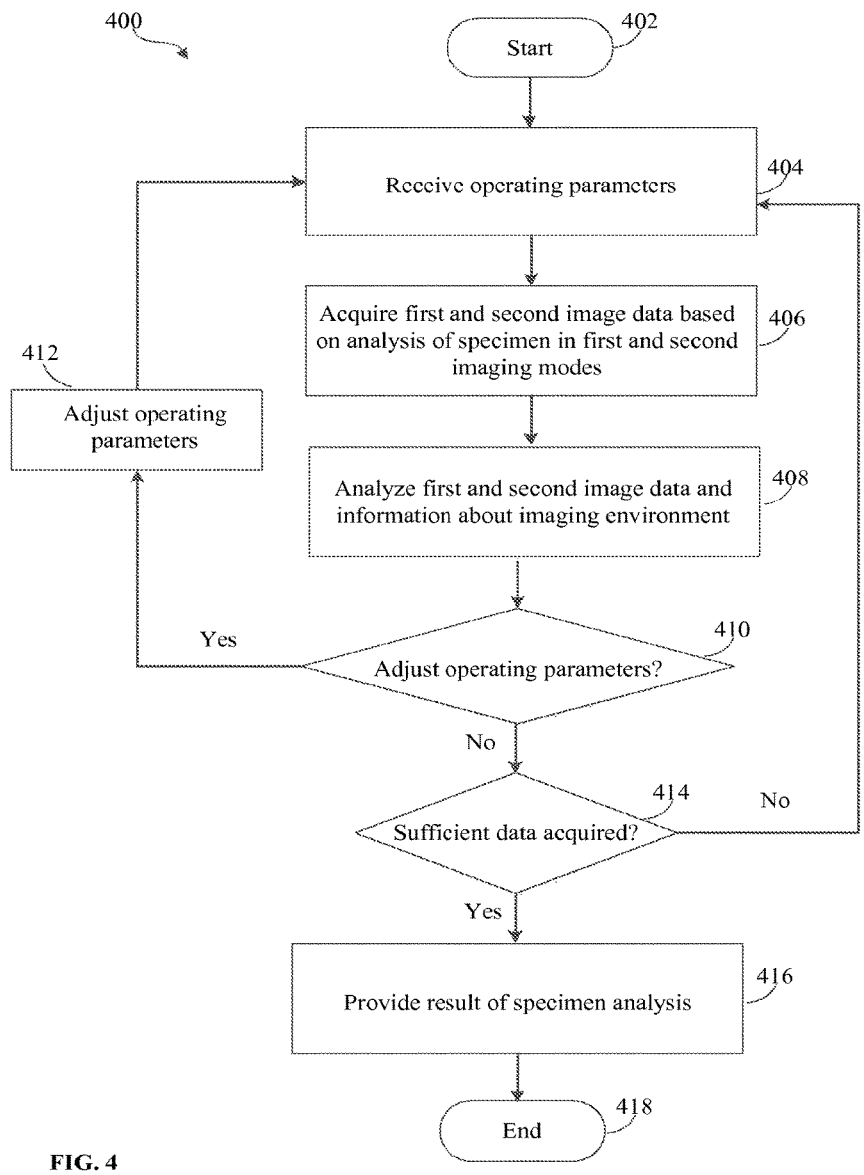
FIG. 4 is a flowchart illustrating a process of analysis of a specimen and control of the analysis process using the described techniques.

FIG. 4 illustrates an example of a process 400 of analysis of a specimen in accordance with some implementations of the current subject matter. The process 400, which is a more detailed representation of the process 300, can be implemented in an imaging system, such as, for example, by imaging system 100 (FIG. 1) or 200 (FIG. 2), or in other suitable imaging system.

As shown in FIG. 4, after the process 400 starts at block 402 at a suitable time, one or more components of the imaging system can receive, at block 404, operating parameters relating to control of operation of the components to perform analysis of the specimen. The operating parameters can include parameters relating to supplying energy to the specimen by at least one energy supplying component (e.g., energy supplying component 112 in FIG. 1). Non-limiting examples of operating parameters can include a field evaporation rate, a field ionization rate, parameters for image medium formation, parameters for image medium control, parameters of data collection. The operating parameters can also include parameters for operation of a controller, such as controller 104 (FIG. 1), and/or operating parameters for other component(s) of the imaging system. The operating parameters can be set based on user input. For example, user input can be received from a user of the imaging system via a suitable user interface (e.g., a user interface associated with a controller, or any other user interface). The parameters can also be set automatically, without user input, or based on a combination of user input and automatic settings.

The energy supplying component can use the operating parameters to supply required amount of energy to the specimen in a desired pattern to acquire first and second image data based on analysis of specimen in first and second imaging modes, at block 406. The first, non-destructive imaging mode can be a field ionization imaging mode and the second, destructive imaging mode can be a field evaporation imaging mode.

The acquired first and second image data can be transmitted to a suitable data processing system, such as data processing system 106 (FIG. 1) where the acquired first and second image data can be processed and analyzed, as shown in block 408. The described techniques for analysis of a specimen at an atomic level can include methods for automated image feature recognition in order to exert control over operation of components of the imaging system for smooth data acquisition.

Using both field evaporation imaging mode and field ionization imaging mode can provide an advantage such that sub-angstrom resolution spatial data for a position of specific atoms acquired using the field ionization imaging mode can be combined with a time of flight data for that atom when it is removed in the field evaporation imaging mode. When the image data is processed using a data processing system and a controller, the results can provide synergistic correlative information that increases the quality or quantity of data and information available and/or be used to provide dynamic reactive feedback operation parameter control of individual imaging modes and/or be used to provide dynamic reactive feedback for the integrated imaging mode operation parameters. Correlative data from multiple imaging modes can be used to recognize features describing the specimen. For atoms, features representing atom species can be combined with spatial location information acquired using field ionization data. The described techniques can achieve a higher spatial resolution using a geometric super resolution (also referred to as a "localisation super resolution") computational approach.

Information about imaging environment of the specimen can be provided to the data processing system along with the first and second image data, as shown at block 408. The information about the environment of the specimen can include a temperature, pressure, or other parameters of the conditions within the imaging chamber, and parameters relating to energy applied to the specimen (e.g., pulse number, duration, and patterns, and other information).

It can then be determined, at decision block 410, based on the processing and analysis of the first and second image data and the information about imaging environment of the specimen, whether to adjust the operating parameters. For example, it can be determined whether a desired quantity of image data has been acquired via a field ionization imaging mode before field incrementing a depth characterization of the specimen by field evaporation.

The imaging system can be configured to monitor conditions of the specimen as the specimen is being analysed. This can be achieved by analysing images of the specimen to determine a current shape of the specimen, atoms being analysed, and other characteristics of the specimen. During the operation of the imaging system in the field evaporation mode, specimen atoms are removed from the imaged surface of the specimen. Thus, a shape of the imaged specimen surface, which can be a needle-shaped prior to the imaging analysis, can change in various ways as the specimen analysis proceeds. For example, a radius of the tip can increase due to specimen atoms being removed which result in removal of consecutive layers of the specimen surface. Depending on the original shape of the specimen, the radius of the specimen can vary in other ways as the specimen is being analysed. For example, the radius of the specimen tip can decrease. Regardless of the way in which the shape of the specimen changes during the specimen analysis, energy supplied by energy supplying components can be regulated in response to the change in the shape of the specimen.

Furthermore, the specimen can be composed of atoms and/or regions of atoms that require different field strengths to achieve a desired field evaporation rate. Energy supplied by energy supplying components (e.g., laser and/or voltage energy) and/or other operating parameters can be adjusted to achieve a desired evaporation rate based on atomic composition of the specimen. The operating parameters used to control one or both of the field ionization and field evaporation modes can be varied in response to different regions within a specimen that possess different imaging characteristics.

In some implementations, a rate of field-evaporation of specimen atoms can be determined and the energy being supplied can be regulated to maintain a desired field evaporation rate.

Information obtained based on analysis of one or both first image data (obtained in a non-destructive imaging mode) and second image data (obtained in a destructive imaging mode) can be used to determine whether to adjust one or more operating parameters of the imaging system and the manner in which to adjust the parameters.

The first and second image data can be analysed in order to determine a position (e.g., x, y, z coordinates) and elemental identity of each atom in the specimen. The first image data acquired in the field ionization imaging mode records gas ions that represent individual specimen atoms. The gas atoms detected by a suitable position-sensitive detector can be represented as two-dimensional (2D) discs on the detector, or as three-dimensional 3D cylinders when reconstructed with z direction as time. In some implementations, these representations of the gas atoms can be referred to as "plumes." The plumes can then be analysed and stereographically reconstructed using a suitable data mining approach in order to find the x, y, z coordinates of specimen atoms. A geometrical super-resolution or other approaches can be used to analyse the point-spread geometry of the plumes to approximate the original location of the specimen atom. This can involve, for example, using the x, y centroid of the plume, and minimum z of the plume.

In some implementations, a comparison of a current image of the specimen surface acquired in the field ionization mode (which is preceded by acquiring an image of the specimen atom in the field evaporation mode) to a previous image of the specimen surface acquired in the field ionization mode that was followed by the image acquisition in the field evaporation mode allows determining a location of the specimen atom removed in the field evaporation mode. For example, each detected specimen atom (e.g., using a TOFMS system) can be matched with a disappearing atom plume in the images acquired via field ionization. In this way, the x, y centroid of the plume can be combined with the voltage recorded for the field evaporation specimen atom. Each specimen atom can thus be represented as: centroid-x, centroid-y, Voltage. Such a representation allows reconstruction of the acquired data using any technique that converts voltage to a z position.

In some implementations, x and y coordinates of the gas atoms detected by a detector can be taken as the x/y centroid of the plume. A z coordinate can be a minimum-z or maximum-z of the plume, or it can defined in other ways, such as, for example, the first $dz/dt=0$ which is the first plateau in emission current of gas ions.

The techniques used to analyse the imaging data can include accounting for distortions in the specimen. For example, crystallographic parameters can be measured based on the data. Also, spatial distortions that are non-physical in nature, such as curved lattice planes or high or low atomic density, can be determined from the data. Curved lattice planes can be measured, for example, by using a moving least square algorithm to connect atoms in planes and then by comparing the curvature to a true planar lattice form. However, any other techniques can be utilized additionally or alternatively. Atomic density of the specimen can be measured, for example, by using a nearest neighbour point density analysis or any other suitable approach.

Referring back to FIG. 4, if it is determined, at decision block 410, that the operating parameters need to be adjusted, process 400 can follow to block 412 where the one or more of the operating parameters can be adjusted. The adjusted parameters can be transmitted to the appropriate component(s) of the imaging system, at block 404, and the imaging system can continue performing the process 400 using the adjusted parameters.

Alternatively, if it is determined, at decision block 410, that the operating parameters need not to be adjusted, the process 400 can follow to decision block 414 where it can be determined whether sufficient data has been acquired. The processing at block 414 can be similar to that at block 308 in FIG. 3. If it is determined that the sufficient data has been acquired, the process 400 can follow to block 416 where the result of the imaging analysis of the specimen can be provided in any suitable manner. However, if it is determined, at decision block 414, that sufficient data has not been acquired, the process 400 can return to block 404 to use the previously set operating parameters to acquire subsequent images of the specimen.

After the result of the imaging analysis of the specimens is provided at block 416, the process 400 can end at block 418.

The imaging system in accordance with some embodiments can have a number of different configuration, as shown below in FIGS. 5-8.

Figure 5:
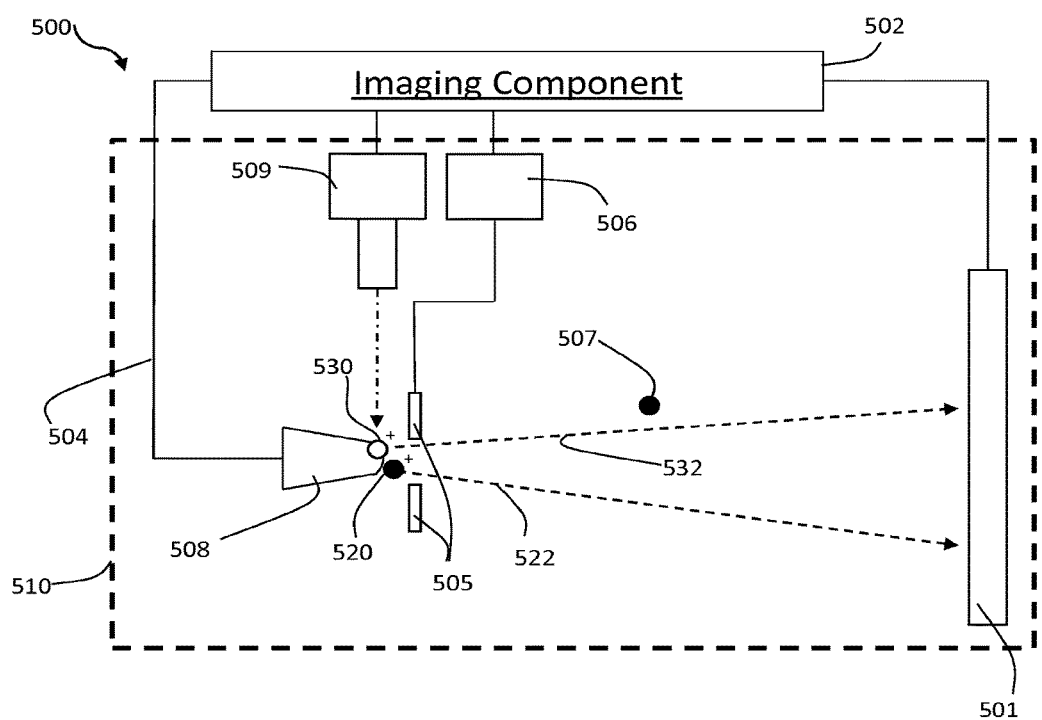
FIG. 5 is a schematic diagram illustrating an example of an imaging component of an imaging system.

FIG. 5 illustrates another example of an imaging component 502 of an imaging system 500 configured to analyze a specimen 508 disposed in a chamber 510. The imaging system 500 includes a voltage control line 504, a counter electrode 505, a voltage source 506, and a laser source 509. The imaging system 500 can be configured to operate in voltage- and laser-based multimodal imaging configuration using a combination of field ionization and field evaporation modes. In this example, a voltage on the control line 504 is applied to specimen 508, a voltage from the voltage source 506 is applied to the counter electrode 505, and laser radiation from the laser source 509 is applied to the specimen 508, in order to either stimulate imaging gas atoms 507 such that ionized imaging gas atoms 520 are accelerated toward a detector 501 along a trajectory 522, or to stimulate atoms of the specimen 508 such that ionized specimen atoms 530 are accelerated toward the detector 501 along a trajectory 532. The voltage applied to the specimen 508 on the control line 504 can be either continuous (DC) and/or pulsed. The voltage applied from the voltage source 506 to the counter electrode 505 can be either continuous (DC) and/or pulsed. The laser radiation from the laser source 509 applied to the specimen 508 can be either continuous wave (cw) and/or pulsed. A voltage difference can constantly or at intervals be present between the specimen 508 and the counter electrode 505, as well as between the specimen 508 and the detector 501, which can allow ionized gas particles 520 to accelerate toward the detector 501 along the trajectory 522 to provide a projection of ions for imaging of the specimen 508.

Figure 6:
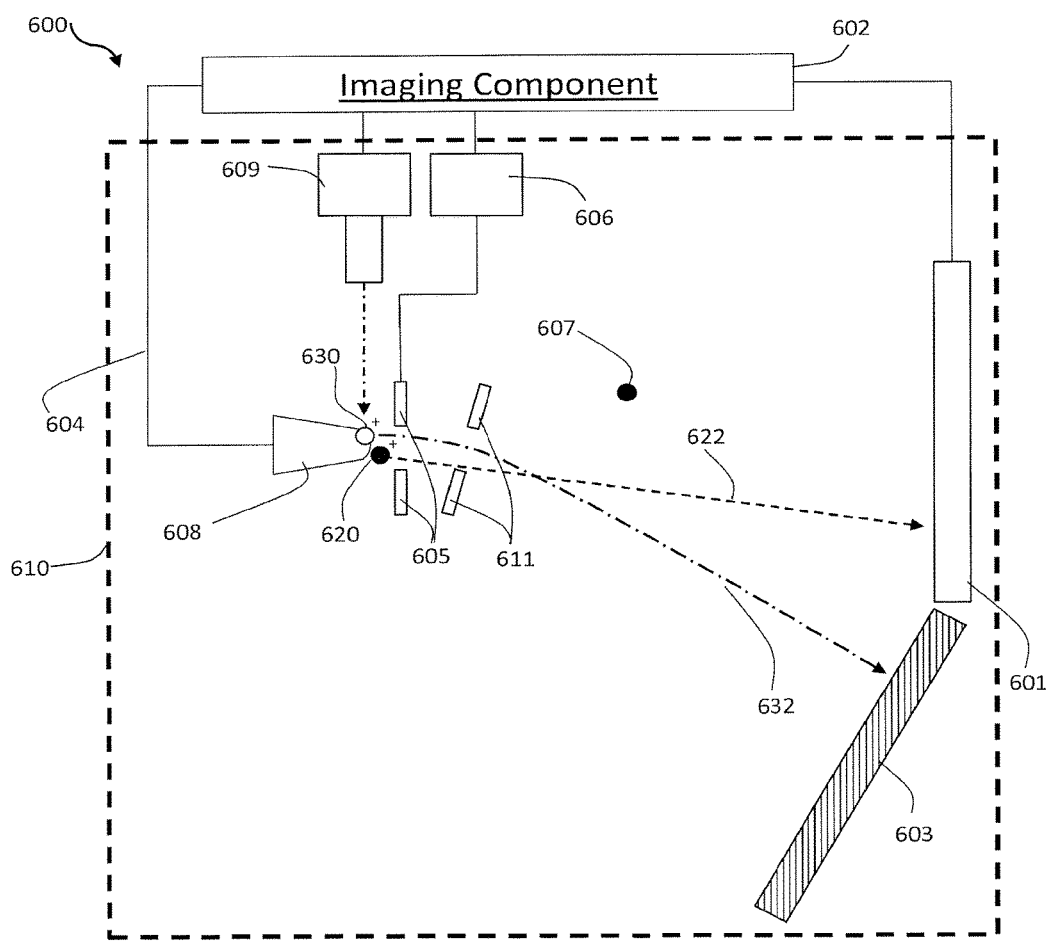
FIG. 6 is a schematic diagram illustrating another example of an imaging component of an imaging system.

FIG. 6 illustrates another example of an imaging component 602 of an imaging system 600 configured to analyze a specimen 608 disposed in a chamber 610. The imaging component 602 includes a voltage control line 604, a counter electrode 605, a voltage source 606, a laser source 609, and a charged particle lens 611. As shown in FIG. 6, in this example, the imaging component 602 includes a first detector 601 and a second detector 603, to provide a multimodal imaging configuration using field ionization and field evaporation modes with improved signal detection. In this example, a voltage on the control line 604 is applied to specimen 608, a voltage from the voltage source 606 is applied to the counter electrode 605, and laser radiation from the laser source 609 is applied to the specimen 608, in order to either stimulate imaging gas atoms 607 such that ionized imaging gas atoms 620 are accelerated toward the first detector 601 along a trajectory 622, or to stimulate atoms of the specimen 608 such that ionized specimen atoms 630 are accelerated toward the second detector 603 along a trajectory 632.

The charged particle lens 611 can be used to deflect field evaporated atoms 530 of the specimen 608 via the trajectory 632 to the second detector 603, as shown in FIG. 6. The voltage applied to the specimen 608 on the control line 604 can be either continuous (DC) and/or pulsed. The voltage applied from the voltage source 606 to the counter electrode 605 can be either continuous (DC) and/or pulsed. The laser radiation from the laser source 609 applied to the specimen 608 can be either continuous wave (cw) and/or pulsed.

Figure 7:
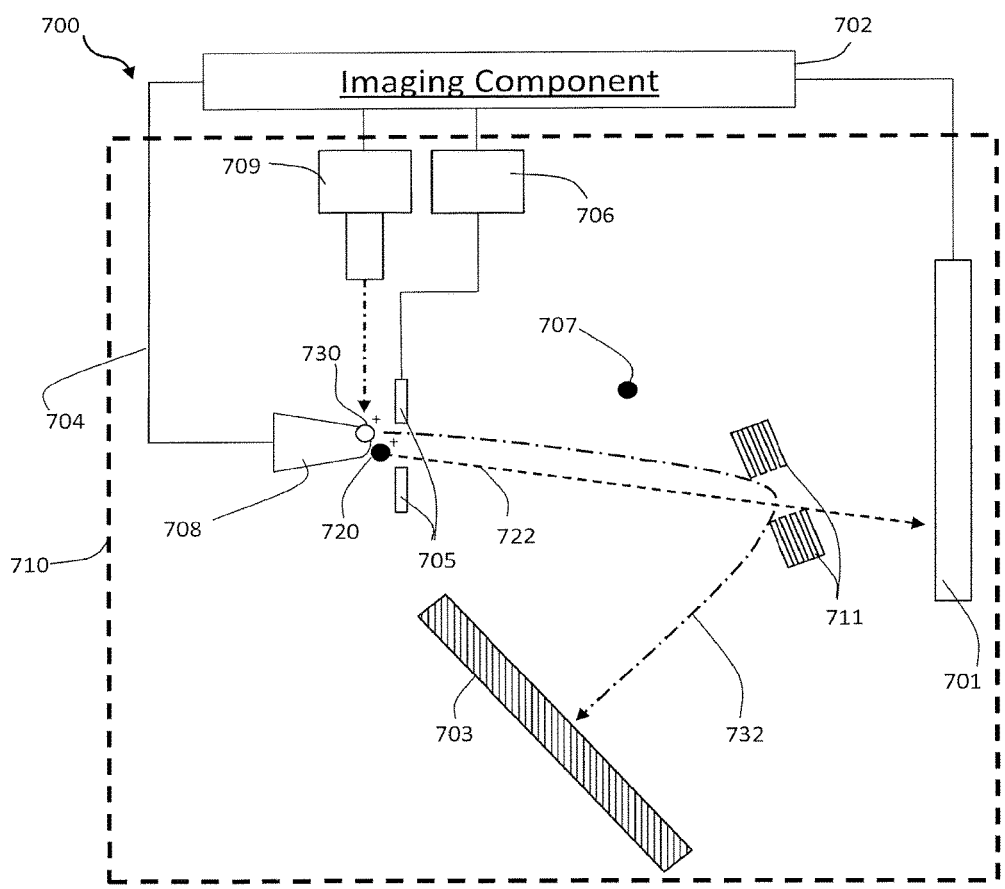
FIG. 7 is a schematic diagram illustrating another example of an imaging component of an imaging system.

FIG. 7 illustrates another example of an imaging component 702 of an imaging system 700 configured to analyze a specimen 708 disposed in a chamber 710. The imaging component 702 includes a voltage control line 704, a counter electrode 705, a voltage source 706, a laser source 709, and a charged particle lens 711. As shown in FIG. 7, in this example, the imaging component 702 includes a first detector 701 and a second detector 703, to provide a multimodal imaging configuration using field ionization and field evaporation modes with improved signal detection. In this example, a voltage on the control line 704 is applied to specimen 708, a voltage from the voltage source 706 is applied to the counter electrode 705, and laser radiation from the laser source 709 is applied to the specimen 708, in order to either stimulate imaging gas atoms 707 such that ionized imaging gas atoms 720 are accelerated toward the first detector 701 along a trajectory 722, or to stimulate atoms of the specimen 708 such that ionized specimen atoms 730 are accelerated toward the second detector 703 along a trajectory 732.

In the example of FIG. 7, the charged particle lens 711 is disposed differently within the imaging chamber 710 relative to the specimen 708. The charged particle lens 711 can act as a mass resolution enhancing reflectron. The charged particle lens 711 can be used to deflect field evaporated atoms 730 of the specimen 708 via the trajectory 732 to the second detector 703, as shown in FIG. 7. The voltage applied to the specimen 708 on the control line 708 can be either continuous (DC) and/or pulsed. The voltage applied from the voltage source 706 to the counter electrode 705 can be either continuous (DC) and/or pulsed. The laser radiation from the laser source 709 applied to the specimen 708 can be either continuous wave (cw) and/or pulsed.

In some implementations of the subject matter described herein, an imaging system can use positrons to ionize specimen. For example, a positron beam can be employed in a controlled manner in an imaging mode in order to ionize imaging gas atoms adsorbed to a surface of the specimen and/or to ionize and evaporate specimen atoms, thus providing a medium for imaging.

A configuration of the positron beam 819 can be tuned for desired interaction mechanism(s) with the specimen, such as, for example, for formation of positronium (Ps) or for direct collision annihilation. FIGS. 25A, 25B, 26A, 26B, 27A, 27B, 27C, 28A and 28B below illustrate different variations in ionization behavior based on different beam configurations. Some implementations employing positron ionization instead of or in addition to other approaches can have certain advantages over voltage- or laser-based ionization/evaporation. Advantages include specimen fracture or damage reduction, for example, voltage and laser methods impose high electric field stresses that cause fracture and high thermal loads may result in surface atom rearrangement damage. Advantages also include tuning the positron beam for ionization specificity, for example, for targeting certain atomic or molecular bonds, or for tuning for vibrational resonances to greatly enhance annihilation rates. The alternative interaction mechanisms that stimulate evaporation can allow analyzing a different and increased range of materials, including physically or chemically delicate materials, for example, biological materials.

Figure 8:
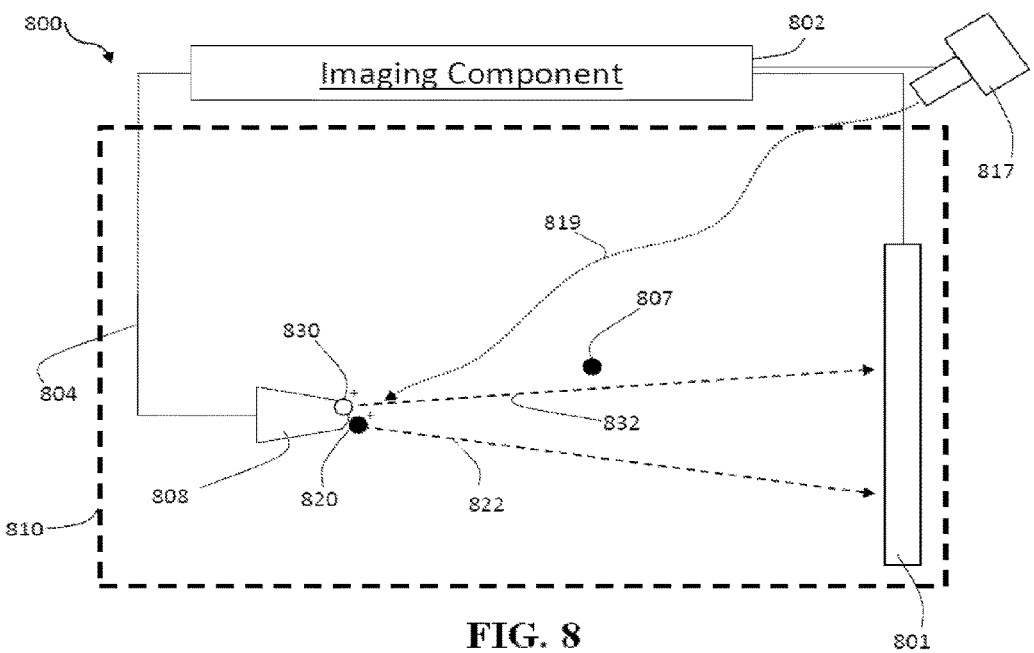
FIG. 8 is a schematic diagram illustrating another example of an imaging component of an imaging system.

FIG. 8 illustrates another example of an imaging component 802 of an imaging system 800 configured to analyze a specimen 808 disposed within the chamber 810. The imaging component 802 can be configured to operate in voltage- and positron-based multimodal imaging configurations using field ionization and field evaporation modes. In this example, a voltage on a control line 804 is applied to the specimen 808 and a positron beam 819 from a positron source 817 is applied to the specimen 808, in order to either stimulate imaging gas atoms 807 such that ionized imaging gas atoms 820 are accelerated toward a detector 801 along a trajectory 822, or to stimulate atoms of the specimen 808 such that ionized specimen atoms 830 are removed from the surface of the specimen 808 and are directed towards the detector 801 along a trajectory 832. The positron beam 819 delivered from the positron source 817 can be focused and it can be applied to the specimen 808 from an angle between about 0 and about 45 degrees. The positron beam 819 can be configured in multiple delivery orientations. The voltage applied to the specimen 808 via the control line 804 can be either continuous (DC) and/or pulsed. The positron beam 819 can also be either continuous and/or pulsed. The imaging component 802 can include other devices, such as, for example, a counter electrode, a laser source, or other devices, as the described techniques can be implemented via a variety of different systems.

In implementations employing positron ionization, instrumentation being used can be configured to detect any emission resulting from positron interaction events. Emissions, such as, e.g., gamma rays resulting from positron annihilation, can be treated similar to any traditional imaging modalities. For example, gamma rays resulting from positron annihilation can be analyzed using positron annihilation lifetime spectroscopy or coincidence Doppler broadening spectroscopy, to provide a complementary multi-modal imaging capability. The positron source can include a beam control module (not shown) adapted to scan the positron beam across the specimen surface, for example, in step-wise increments, or in other manners. The positron beam can use magnetic and/or electrostatic focusing and guidance instrumentation. Evaporated specimen atoms can have their chemical identity and/or originating position (in three-dimensions) determined through conventional atom probe techniques (e.g., time of flight mass spectrometry, a position sensitive detector, etc.).

In some implementations, such as in the imaging system 800 of FIG. 8, the imaging system can include a positron source (e.g., positron source 817) adapted to emit a positron beam (e.g., beam 819) to interact with the specimen to stimulate evaporation of specimen atoms and/or molecules. The positron beam can be focused to a spot on the specimen. Such focused positron spot can be between about 0.1 µm to about 10 µm in diameter, for example the diameter of the focused positron spot on the specimen can be about 0.1 µm, about 0.5 µm, about 1 µm, about 5 µm, or about 10 µm. The positron beam can have a substantially uniform positron density at the focused spot. In some implementations, the positron beam can include monoenergetic positrons. The positron beam can include low-energy positrons, for example less than about 10 keV. The positron beam can include positron with energies below the Ps-formation threshold, Eth, as determined by the formula Ei−EPs, where Ei is the ionization energy of the target and EPs=6.8 eV is the binding energy of the ground-state Ps atom.

An imaging system employing a positron source can also be configured to operate in other imaging modes, for example, voltage- and/or laser-stimulated field-ionization or field-evaporation, or any other imaging modes.

It should be appreciated that, as discussed above, in the imaging systems shown above in connection with FIGS. 2 and 5-8, a field evaporation imaging mode can be conducted without removing an imaging gas from an imaging chamber having a specimen disposed therein. However, in some cases, the imaging gas can be removed from the imaging chamber at least in part or in its entirety. Furthermore, it should be appreciated that any of the features of the imaging systems shown in FIGS. 2 and 5-8 can be used in any suitable combination.

FIGS. 9-19 below illustrate various examples of imaging systems that can be used to implement the described specimen analysis techniques. It should be appreciated that any of the features of the imaging systems shown in FIGS. 9-19 can be used in any suitable combination.

Figure 9:
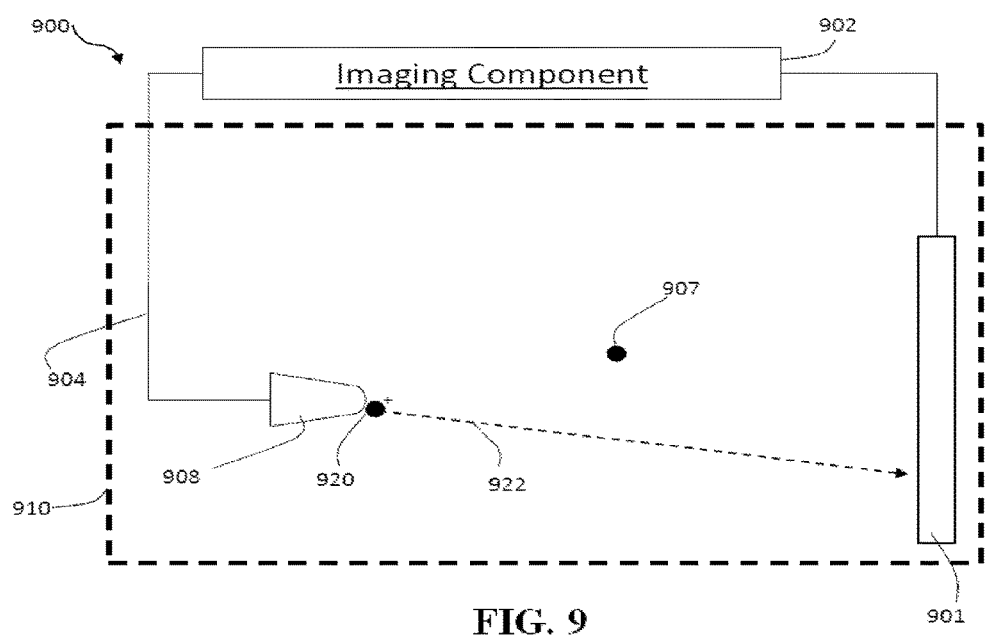
FIG. 9 is a schematic diagram illustrating another example of an imaging component of an imaging system.

FIG. 9 is an example of an imaging component 902 of a voltage based field ionization imaging system 900 for imaging a specimen 908 disposed within an imaging chamber 910 filled with an imaging gas 907. A voltage is applied to the specimen 908 via an electrical control line 904 to stimulate imaging gas 907 present in the imaging chamber 910, causing a surface atom on the apex of the specimen 908 to become an emitter, or a point-projection source of gas ions. The voltage applied to the specimen 908 causes field ionization of gas atoms 907 such that ionized gas atoms 920 are projected away from the specimen 908 along a trajectory 922 to a detector 921 to provide imaging of the specimen 908. The voltage applied to the specimen 908 can be either a continuous (DC) voltage and/or a pulsed voltage. A voltage difference present between the specimen 908 and the detector 901 causes the ionized gas particles 920 to be accelerated toward the detector 901.

Figure 10:
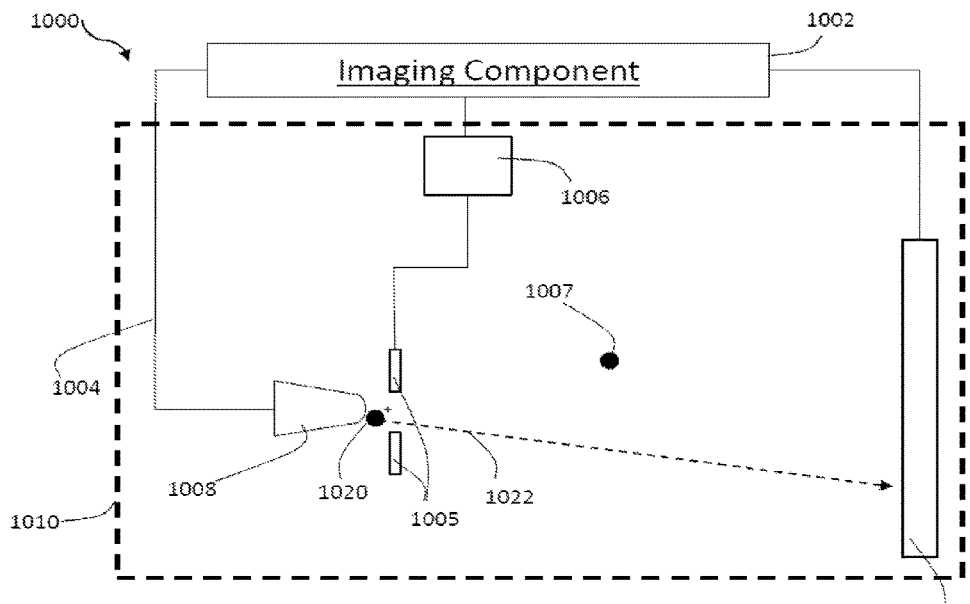
FIG. 10 is a schematic diagram illustrating another example of an imaging component of an imaging system.

FIG. 10 is an example of an imaging component 1002 of a voltage based field ionization imaging system 1000 for high resolution imaging a specimen 1008 disposed within an imaging chamber 1010 filled with an imaging gas 1007. A voltage is applied to the specimen 1008 via an electrical control line 1004 and a voltage is applied to a counter electrode 1005 from a voltage source 1006 in order to stimulate imaging gas atoms 1007 to field ionize such that ionized imaging gas atoms 1020 are caused to be projected to the detector 1001, and to thereby provide imaging of the specimen 1008. The voltage on the control line 1004 that is applied to the specimen 1008 can be either continuous (DC) and/or pulsed. Similarly, the voltage from the voltage source 1006 applied to the counter electrode 1005 can be either continuous (DC) and/or pulsed. A voltage difference present between the specimen 1008 and the counter electrode 1005, as well as a voltage difference between the specimen 1008 and the detector 1001 can cause the gas ions 1020 to be directed to the detector 1001.

Figure 11:
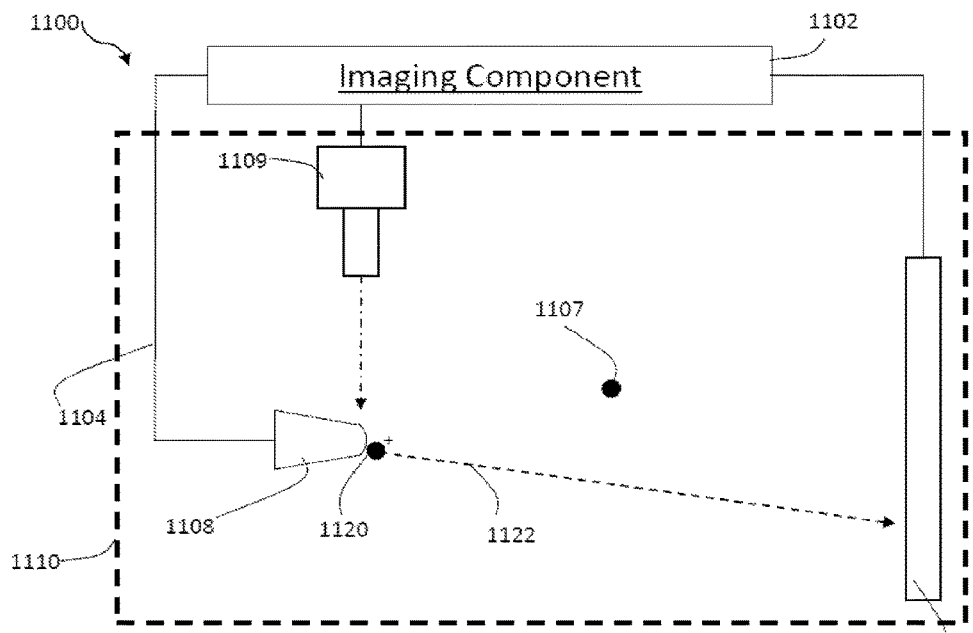
FIG. 11 is a schematic diagram illustrating another example of an imaging component of an imaging system.

FIG. 11 is an example of an imaging component 1102 of an imaging system 1100 for imaging a specimen 1108 disposed within an imaging chamber 1110 filled with an imaging gas 1107. In this example, the imaging component 1102, configured to be operated in a field ionization imaging mode, includes both voltage and laser sources for ionizing atoms of the imaging gas atoms 1107 in the imaging chamber 1110. A voltage is applied via the control line 1104 to the specimen 1108, and a laser source 1109 is configured to irradiate the tip of the specimen 1108 with laser radiation to stimulate atoms of the imaging gas 1107 to field ionize. In this way, ionized imaging gas atoms 1120 are caused to be projected to the detector 1101 to provide imaging of the surface of the specimen 1108. In the example illustrated, the laser beam can be delivered from the laser source 1109 orthogonal to the specimen 1108. However, the laser beam can also be configured to be delivered at angle with respect to specimen 1108. The voltage applied to the specimen 1108 via the control line 1104 can be continuous (DC) and/or pulsed. The laser radiation from the laser source 1109 applied can be either continuous wave (cw) and/or pulsed. A voltage difference present between the specimen 1108 and the detector 1101 can provide projection of gas ions 1120 to the detector 1101.

Figure 12:
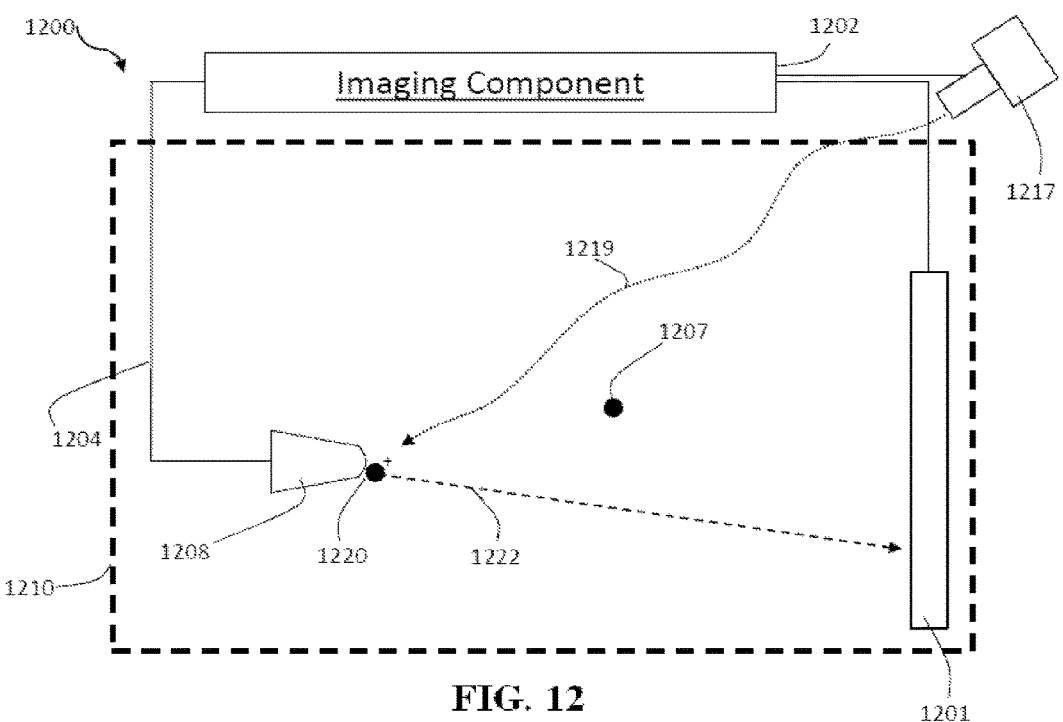
FIG. 12 is a schematic diagram illustrating another example of an imaging component of an imaging system.

FIG. 12 is an example of an imaging component 1202 of an imaging system 1200 for imaging a specimen 1208 disposed within an imaging chamber 1210 filled with an imaging gas 1207. The imaging component 1202, configured to be operated in a field ionization imaging mode, includes both voltage- and positron-based field ionization imaging modes. As shown in FIG. 12, a voltage is applied to the specimen 1208 via an electrical control line 1204, and a positron beam 1219 from a positron source 1217 irradiates the specimen 1208 in order to stimulate atoms of the imaging gas 1207 to field ionize ionized imaging gas atoms 1220 are caused to be projected to the detector 1201 to provide imaging of the surface of the specimen 1208. The positron beam 1219 can be focused and can be applied to the specimen 1208 from an angle between 0 and 45 degrees. The voltage applied to the specimen 1208 from the control line 1204 can be continuous (DC) and/or pulsed. The positron beam 1219 from the positron source 1217 applied to the specimen 1208 can be continuous (DC) and/or pulsed. A voltage difference present between the specimen 1208 and the detector 1201 can provide projection of ions and can include applying a voltage at or in the vicinity of the detector 1201.

Figure 13:
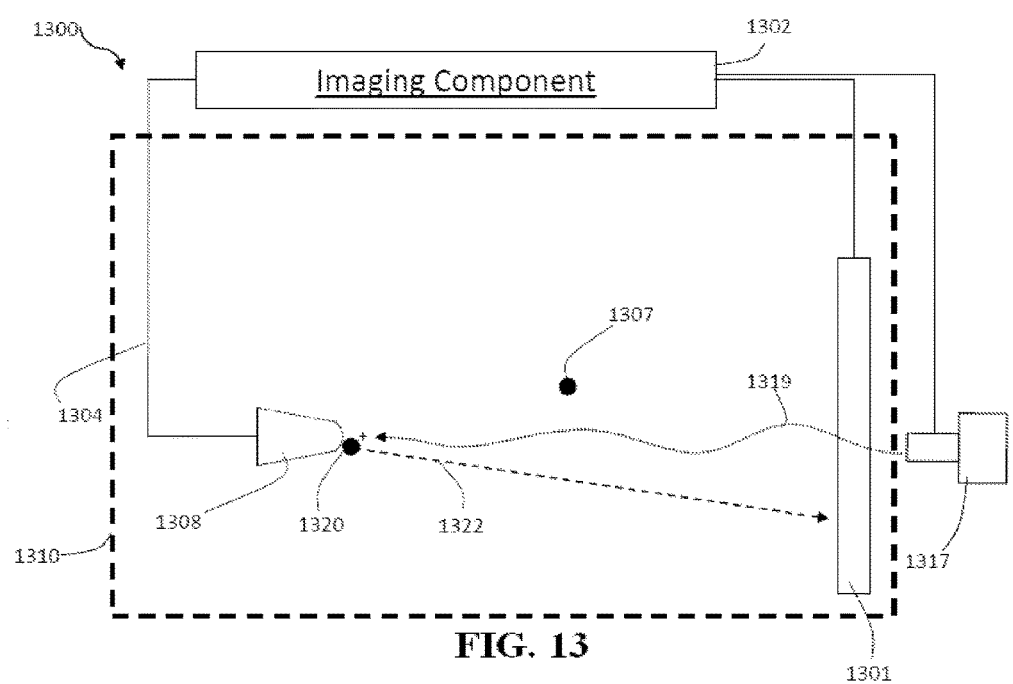
FIG. 13 is a schematic diagram illustrating another example of an imaging component of an imaging system.

FIG. 13 is an example of an imaging component 1302 of an imaging system 1300 for imaging a specimen 1308 disposed within an imaging chamber 1310 filled with an imaging gas 1307. The imaging component is configured to be operated in a voltage and positron based field ionization imaging mode. The imaging component 1302 is similar to imaging component 1202 (FIG. 12) and is therefore not described herein in detail. As shown in FIG. 13, a positron beam 1319 is delivered from a positron source 1317 via a different delivery orientation with respect to the specimen 1308. Specifically, in this example, the positron beam 1319 is delivered parallel to the specimen 1308 and it can be delivered through an aperture (not shown) in the center of a detector 1301.

Figure 14:
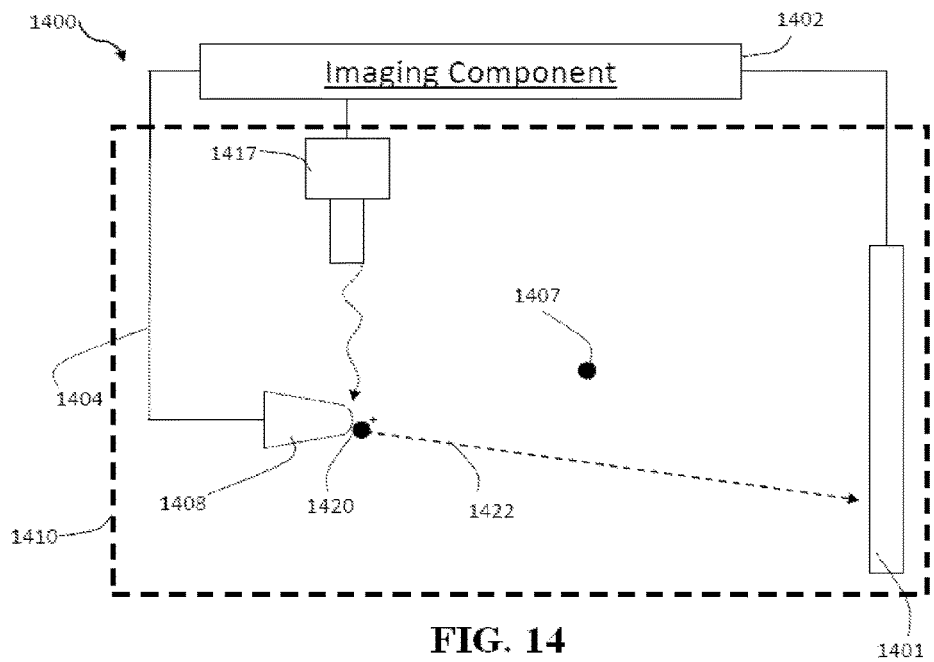
FIG. 14 is a schematic diagram illustrating another example of an imaging component of an imaging system.

FIG. 14 is another example of an imaging component 1402 of an imaging system 1400 for imaging a specimen 1408 disposed within an imaging chamber 1410 filled with an imaging gas 1407. Similar to imaging components 1202 (FIG. 12) and 1302 (FIG. 13), the imaging component 1402 includes both a voltage control line 1204 and a positron source 1417 configured to apply energy to the imaging gas 1407 such that ionized imaging gas atoms 1420 are directed to a detector 1401 via a trajectory 1422. However, in this example, a positron beam 1419 is delivered from the positron source 1417 orthogonal to the specimen 1408.

Figure 15:
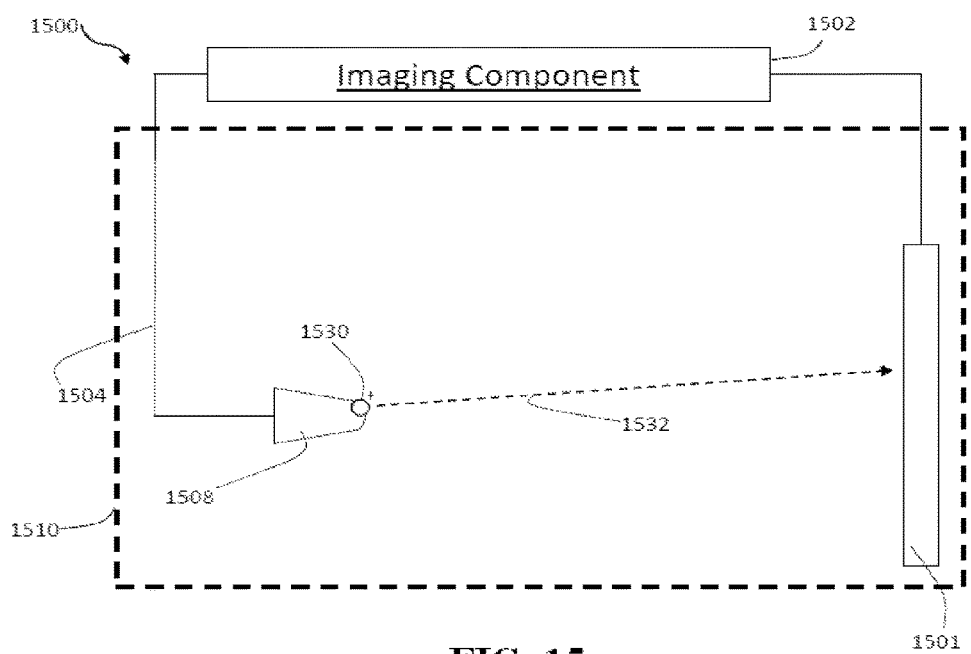
FIG. 15 is a schematic diagram illustrating another example of an imaging component of an imaging system.
Figure 16:
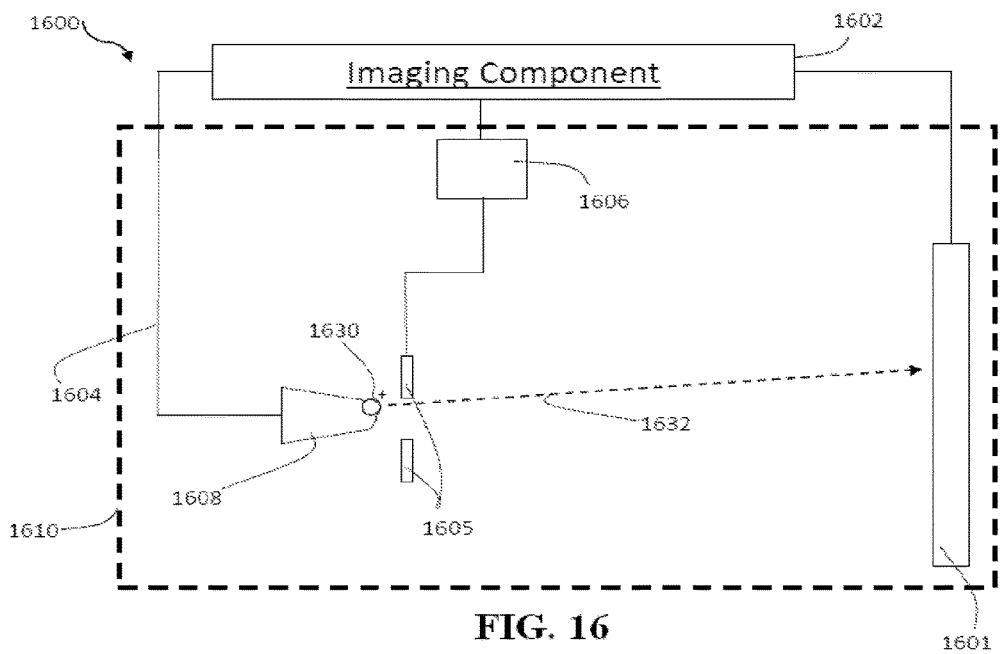
FIG. 16 is a schematic diagram illustrating another example of an imaging component of an imaging system.

FIG. 15 is an example of an imaging component 1502 of an imaging system 1500 for imaging a specimen 1508 disposed within an imaging chamber 1510. The imaging component 1502 is configured to be operated in a voltage-based field evaporation imaging mode. A voltage is applied to the specimen 1508 via a control line 1504 in order to stimulate at least one positively charged specimen atom 1530 to field evaporate and be accelerated, via a trajectory 1532, towards a detector 1501 that images the atom 1530. The voltage applied to the specimen 1508 can be continuous (DC) and/or pulsed. FIG. 16 illustrates a similar imaging component 1602 of an imaging system 1600 for imaging a specimen 1608 disposed within an imaging chamber 1610 via a voltage-based field evaporation imaging mode. A voltage is applied to the specimen 1608 via a control line 1604 and a voltage is applied to an electrode from an electrode source 1606 in order to stimulate at least one positively charged specimen atom 1630 to field evaporate and be accelerated, via a trajectory 1632, towards a detector 1601 that images the atom 1630.

Figure 17:
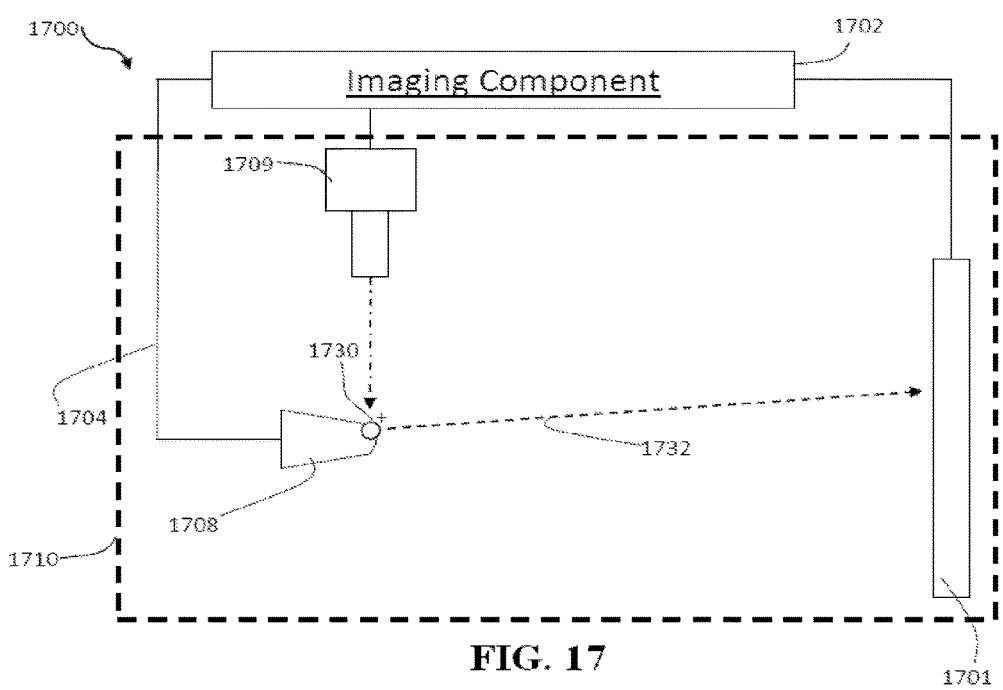
FIG. 17 is a schematic diagram illustrating another example of an imaging component of an imaging system.

FIG. 17 illustrates an example of an imaging component 1702 of an imaging system 1700 for imaging a specimen 1708 disposed within an imaging chamber 1710 via a voltage and laser-based field evaporation imaging mode. A voltage is applied to the specimen 1708 via a control line 1704 and laser radiation from a laser source 1709 is applied to the specimen 1708 in order to stimulate at least one specimen atom 1730 to field evaporate and to be accelerated, via a trajectory 1732, towards a detector 1701 that images the atom 1730. The laser radiation from the laser source 1709 can be delivered orthogonally to the specimen 1708; however, it can be delivered at other angles with respect to the specimen.

Figure 18:
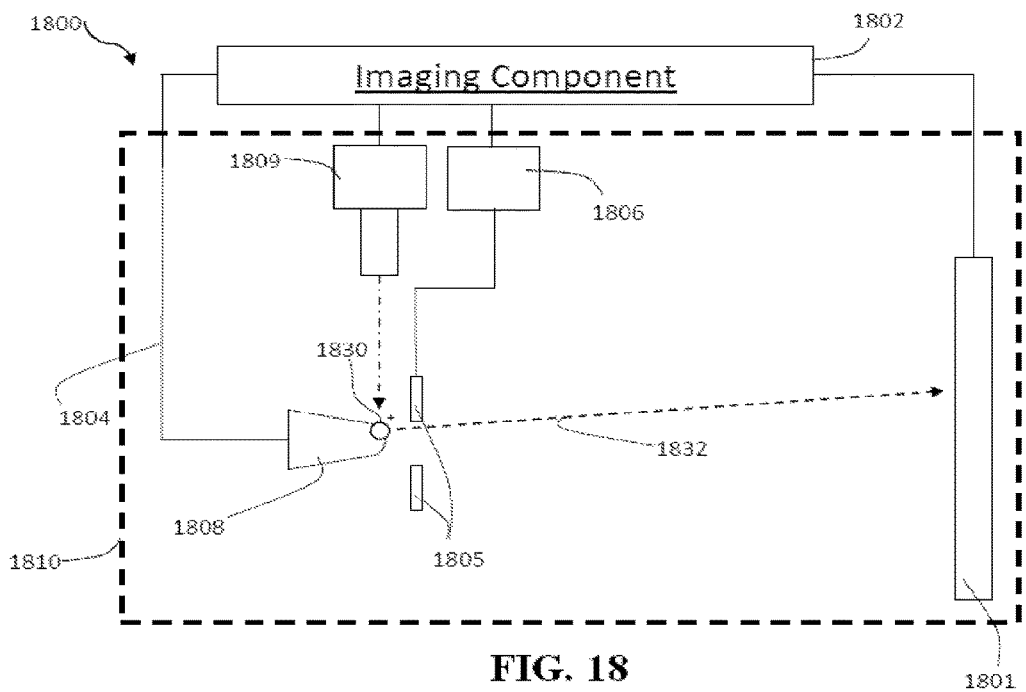
FIG. 18 is a schematic diagram illustrating another example of an imaging component of an imaging system.

FIG. 18 illustrates an example of an imaging component 1802 of an imaging system 1800 for imaging a specimen 1808 disposed within an imaging chamber 1810 via a voltage and laser-based field evaporation imaging mode. The imaging component 1802 includes a voltage control line 1804, a laser source 1809, and a voltage source 1806. A voltage is applied to the specimen 1808 via the control line 1804, a voltage from the voltage source 1806 is applied to an electrode 1805, and laser radiation from a laser source 1809 is applied to the specimen 1808 in order to stimulate at least one specimen atom 1830 to field evaporate and to be accelerated, via a trajectory 1832, towards a detector 1801 that images the atom 1830.

Figure 19:
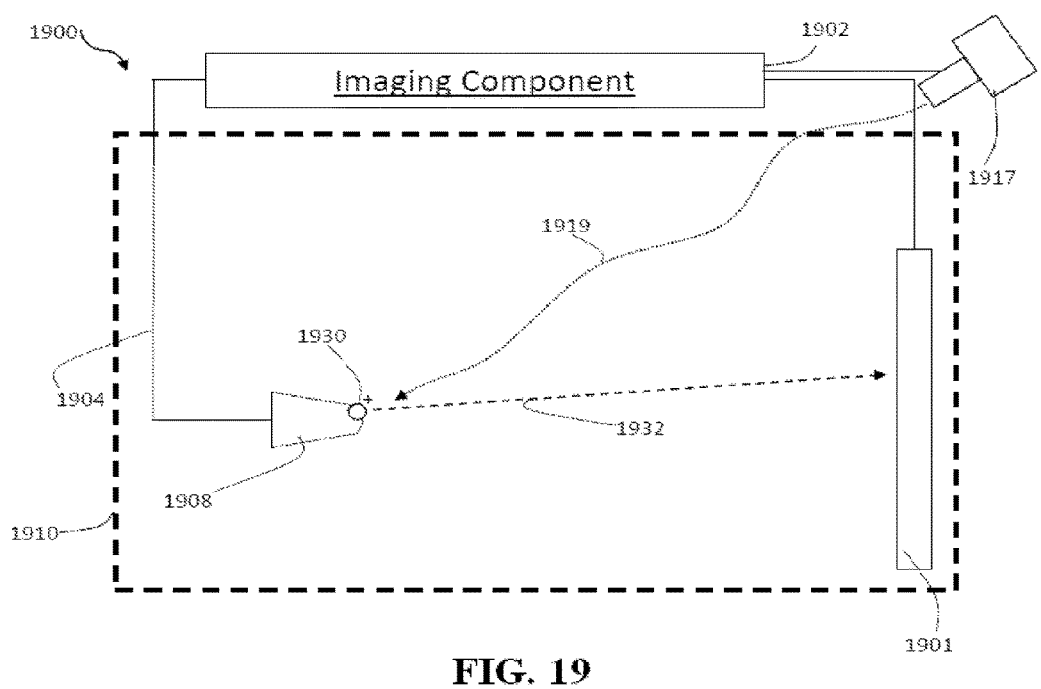
FIG. 19 is a schematic diagram illustrating another example of an imaging component of an imaging system.

FIG. 19 is an example of an imaging component 1902 of an imaging system 1900 for imaging a specimen 1908 disposed within an imaging chamber 1910 via a field evaporation imaging mode. As shown in FIG. 19, a voltage is applied to the specimen 1908 via an electrical control line 1904, and a positron beam 1919 from a positron source 1917 irradiates the specimen 1908 in order to stimulate at least one specimen atom 1930 to field evaporate and to be accelerated, via a trajectory 1932, towards a detector 1901 that images the atom 1930. The positron beam 1919 can be focused and can be applied to the specimen 1908 from an angle between about 0 degrees and about 45. However, the positron beam can be configured in multiple delivery orientations. The voltage applied to the specimen 1908 from the control line 1904 can be continuous (DC) and/or pulsed.

The positron beam 1919 from the positron source 1917 applied to the specimen 1908 can be either continuous (DC) and/or pulsed.

Figure 20:
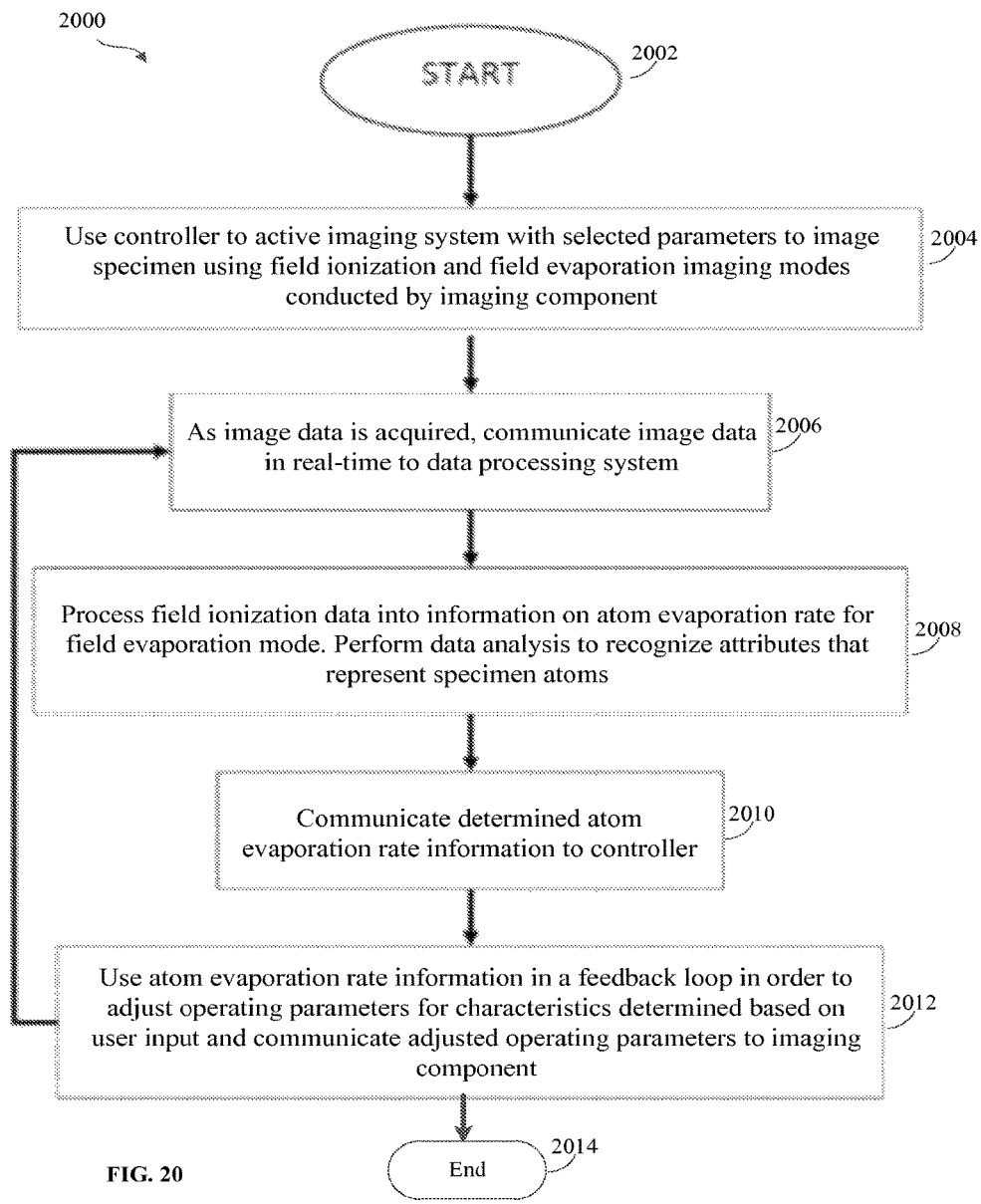
FIG. 20 is a flowchart illustrating a process of processing in real time information acquired during analysis of a specimen by an imaging system and using the information to control operation of the imaging system.

FIG. 20 illustrates a process 2000 of processing and using image data acquired by imaging a specimen in field ionization and field evaporation imaging modes of an imaging system (e.g., system 100 in FIG. 1). The process 2000 can start at block 2002 at any suitable time, e.g. when the imaging system is activated. At block 2004, a controller (e.g., controller 104 in FIG. 1) can be used to active the imaging system with selected operating parameters to image a specimen using field ionization and field evaporation imaging modes conducted by an imaging component (e.g., imaging component 102 in FIG. 1, or imaging components of any of the imaging systems described herein) of the imaging system. Further, at block 2006, as image data (e.g., first and second image data acquired in field ionization and field evaporation modes, respectively) is acquired, the image data can be communicated in real-time to a data processing system (e.g., data processing system 106 in FIG. 1). At block 2008, field ionization data from the acquired image data can be converted into information on an atom evaporation rate for a field evaporation mode. Also, at block 2008, imaging data can be analyzed to recognize attributes that represent specimen atoms. At block 2010, the determined information on the atom evaporation rate can be transmitted or communicated to the controller such that, at block 2012, the controller can use the atom evaporation rate information in a feedback loop in order to adjust operating parameters for characteristics determined based on user input. For example, as mentioned above, operating parameters used to control operation of the imaging system can be set at least in part based on user input, which can be done in the beginning of the specimen analysis or at any time during the analysis. The adjusted operating parameters can be transmitted or communicated to the imaging component such that these parameters can be used for subsequent operation of the component to analyze the specimen. The process 2000 can end at block 2014.

Figure 21:
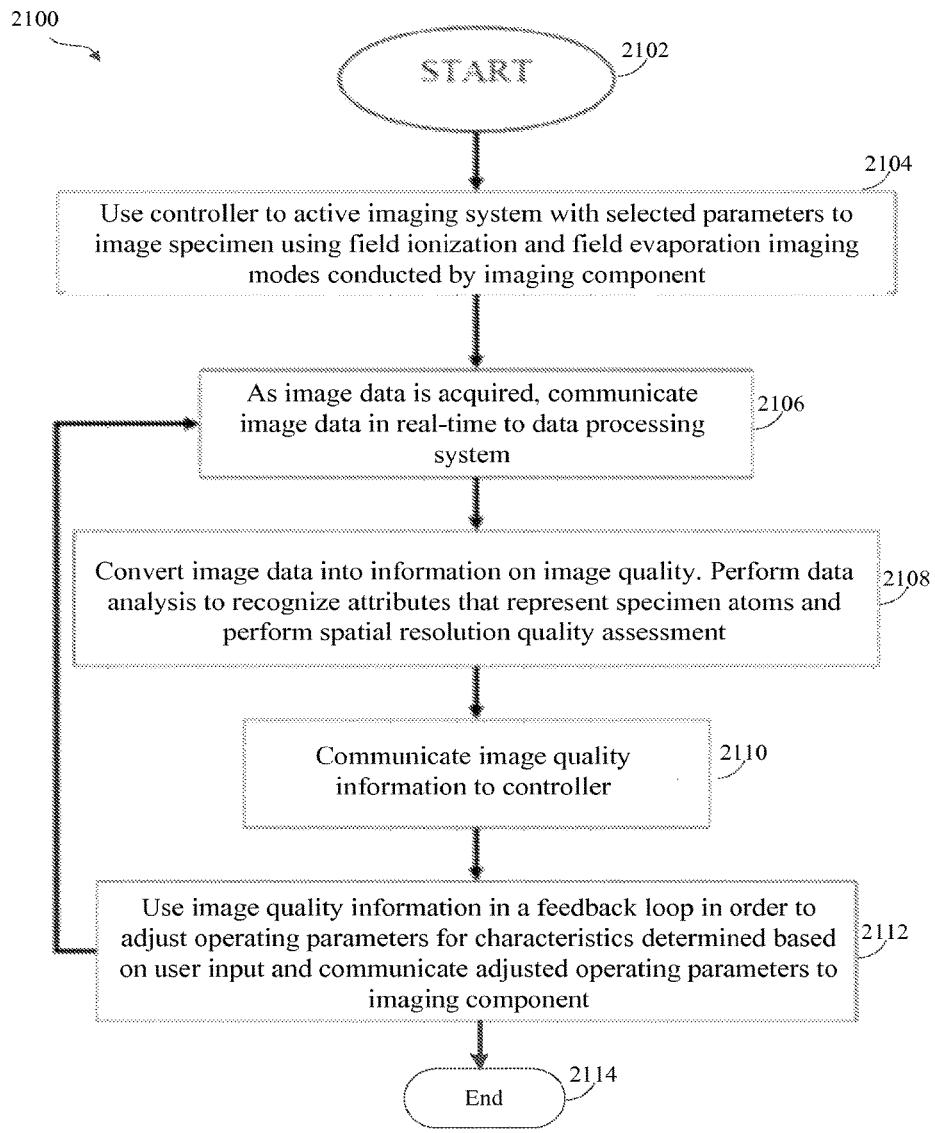
FIG. 21 is another flowchart illustrating a process of processing in real time information acquired during analysis of a specimen by an imaging system and using the information to control operation of the imaging system.

FIG. 21 illustrates a process 2100 of processing and using image data acquired by imaging a specimen in field ionization and field evaporation imaging modes of an imaging system (e.g., system 100 in FIG. 1). The process 2100 can start at block 2102 at any suitable time. At block 2104, a controller (e.g., controller 104 in FIG. 1) can be used to active the imaging system with selected operating parameters to image a specimen using field ionization and field evaporation imaging modes conducted by an imaging component (e.g., imaging component 102 in FIG. 1, or imaging components of any of the imaging systems described herein) of the imaging system. Further, at block 2106, as image data (e.g., first and second image data acquired in field ionization and field evaporation modes, respectively) is acquired, the image data can be communicated in real-time to a data processing system (e.g., data processing system 106 in FIG. 1). At block 2108, image data can be converted into information on image quality, and data analysis to recognize attributes that represent specimen atoms and spatial resolution quality assessment can be performed. At block 2110, the determined image quality information can be transmitted or communicated to the controller such that, at block 2112, the controller can use the image quality information in a feedback loop in order to adjust operating parameters for characteristics determined based on user input. The adjusted operating parameters can be transmitted or communicated to the imaging component such that these parameters can be used for subsequent operation of the component to analyze the specimen. The process 2100 can end at block 2114.

Figure 22:
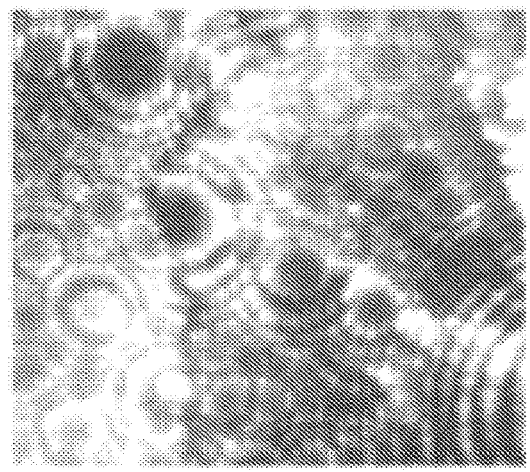
FIG. 22 is an image of a tungsten specimen acquired using field ionization image of the specimen.

FIG. 22 is a representation of an image of a tungsten specimen acquired using field ionization imaging of the specimen. The image can be interpreted to represent specimen atoms and a grain boundary in the tungsten specimen, as described in Ryan, H. F. and J. Suiter, Grain boundary topography in tungsten. Philosophical Magazine, 1964. 10(106): pp. 727-729.

Figure 23:
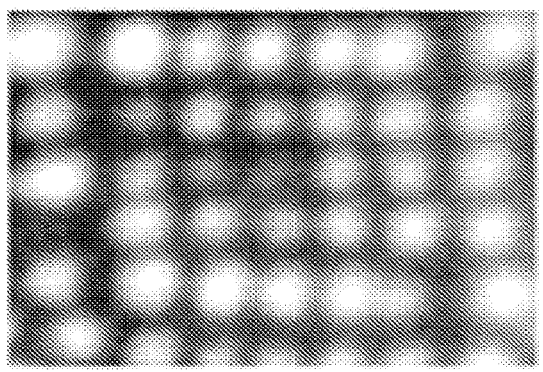
FIG. 23 is an image of a silicon specimen acquired using a high resolution field ionization image.

FIG. 23 is a high-resolution image of a silicon specimen acquired using high resolution field ionization imaging of the specimen. The image can be interpreted to represent locations of atoms in the silicon specimen, as described in Liu, H. M., T. T. Tsong, and Y. Liou, Direct observation of atomic structures and reconstructions of silicon surfaces: A field-ion-microscope study. Physical Review Letters, 1987, 58(15): pp. 1535-1537. The image demonstrates sub-angstrom spatial resolution of silicon.

Figure 24:
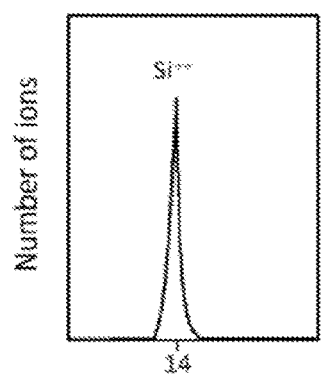
FIG. 24 is a graphical representation of a time of flight spectrometry signal of a silicon specimen.

FIG. 24 is a graphical representation illustrating a time of flight spectrometry peak obtained using a field evaporation imaging mode that can be interpreted to indicate that silicon atoms were present in a specimen being analyzed.

Figure 25A:
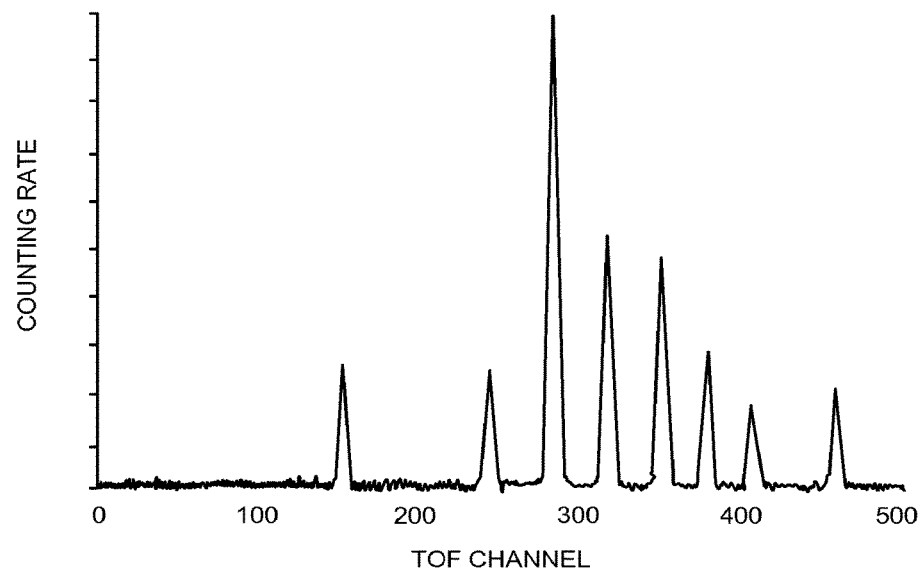
FIG. 25A is a graphical representation illustrating a time of flight spectrum of decane.
Figure 25B:
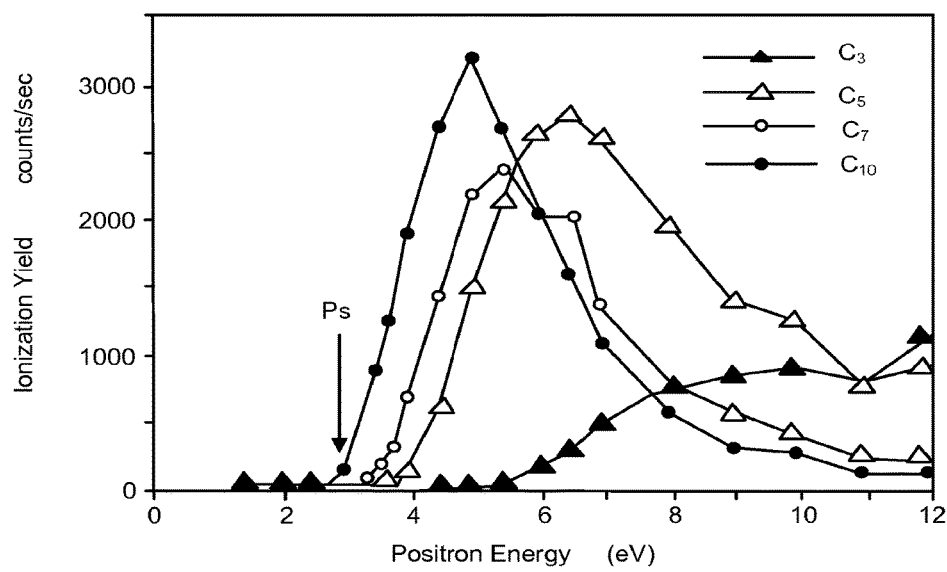
FIG. 25B is a graphical representation illustrating and an ionization yield (counts/sec) of the constituent carbon $C_{10}$, $C_7$, $C_5$, and $C_3$ ions derived from positron ionization of n-decane as a function of positron kinetic energy.

FIG. 25A illustrates a time of flight (TOF) mass spectrum of decane under 7-eV positron impact, and FIG. 25B illustrates an ionization yield (counts/sec) of the constituent carbon $C_{10}$, $C_7$, $C_5$, and $C_3$ ions derived from positron ionization of n-decane as a function of the positron kinetic energy (eV), with positronium (Ps) energy indicated, as described in Xu, J., et al., Positron-induced dissociation of organic molecules. Physical Review A, 1993. 47(2): pp. 1023-1030.

Figures 26A, 26B:
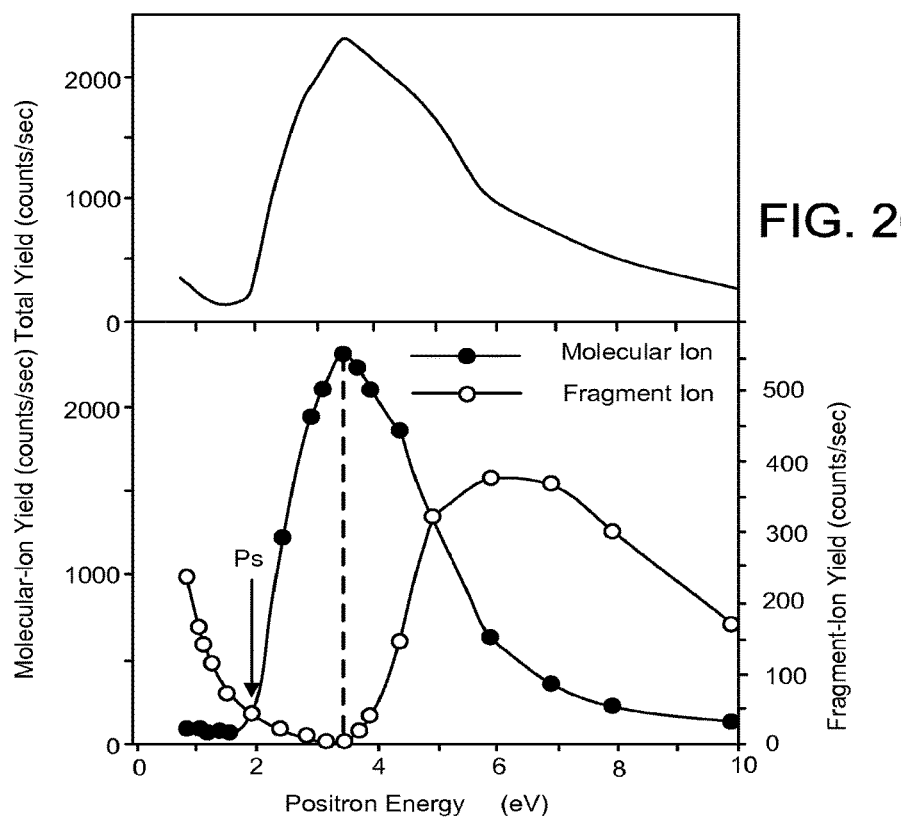
FIG. 26A is a graphical representation illustrating total ion yield from positron ionization of n-butylbenzene as a function of positron kinetic energy.
FIG. 26B is a graphical representation illustrating molecular ion and combined ($C_7H_8^+ + C_7H_7^+$) fragment-ion signals obtained from mass spectra of n-butylbenzene as a function of positron kinetic energy.

FIG. 26A illustrates total ion yield from positron ionization of n-butylbenzene as a function of the positron kinetic energy, and FIG. 26B illustrates molecular ion and combined ($C_7H_8^+$+$C_7H_7^+$) fragment-ion signals obtained from mass spectra of n-butylbenzene as a function of the positron kinetic energy (eV), with positronium (Ps) energy indicated, as described in Xu, J., et al., Positron-induced dissociation of organic molecules. Physical Review A, 1993. 47(2): pp. 1023-1030.

Figures 27A, 27B, 27C:
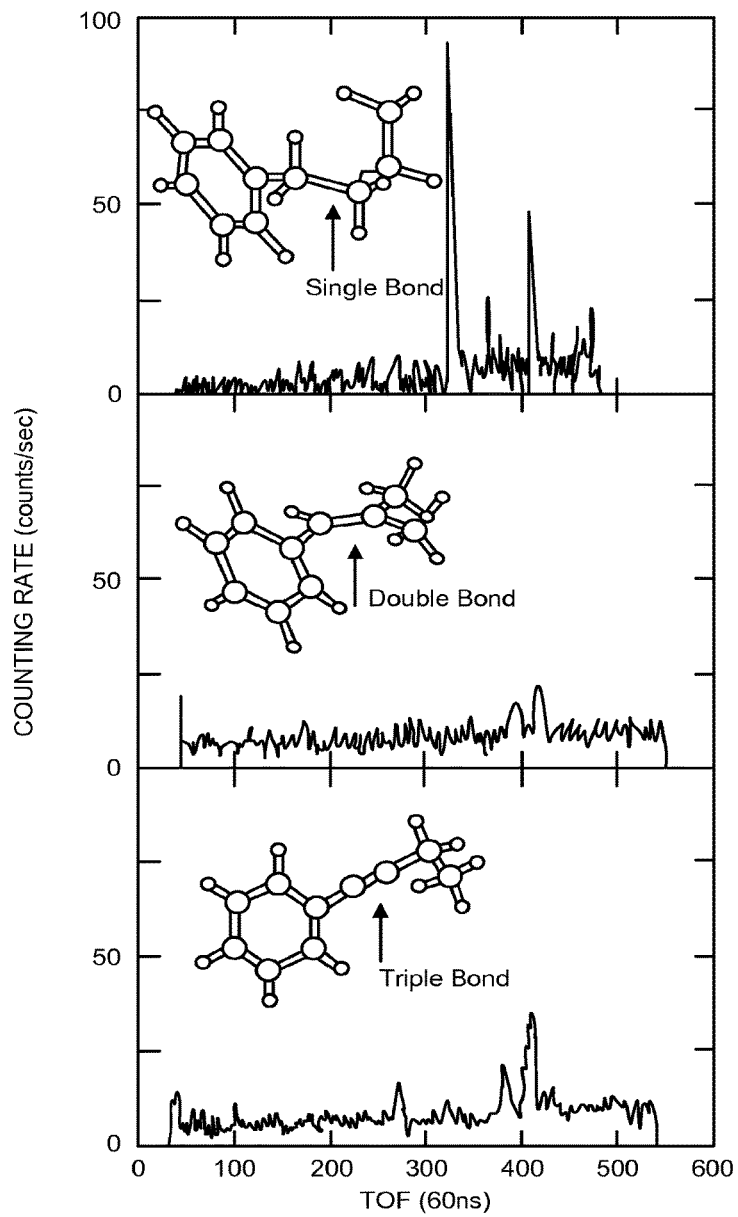
FIG. 27A is a graphical representation illustrating a time of flight (TOF) spectrum produced by 1-eV positrons for butylbenzene.
FIG. 27B is a graphical representation illustrating a TOF spectrum produced by 1-eV positrons for 2-methyl-1-phenyl-1-propene.
FIG. 27C is a graphical representation illustrating a TOF spectrum produced by 1-eV positrons for 1-phenyl-1-butyne.

FIGS. 27A-27C illustrate time of flight (TOF) spectra produced by 1-eV positrons for butylbenzene (FIG. 27A), 2-methyl-1-phenyl-1-propene (FIG. 27B), and 1-phenyl-1-butyne (FIG. 27C), as described in Xu, J., et al., Chemical selectivity in the dissociative ionization of organic molecules by low-energy positrons. Physical Review A, 1995. 52(3): pp. 2088-2094.

Figure 28A:
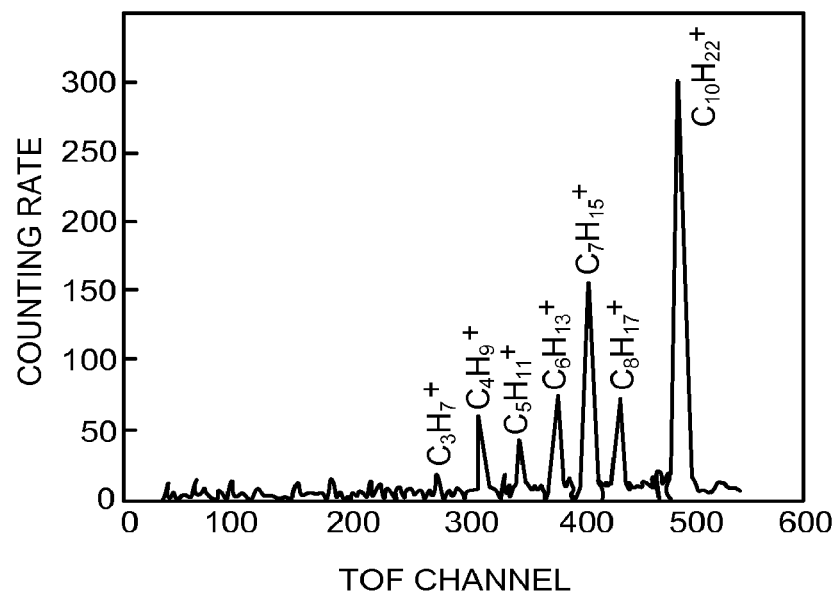
FIG. 28A is a graphical representation illustrating a TOF spectrum for decane produced by positron kinetic energy of 4.3 eV, which is above the positronium formation threshold for decane.
Figure 28B:
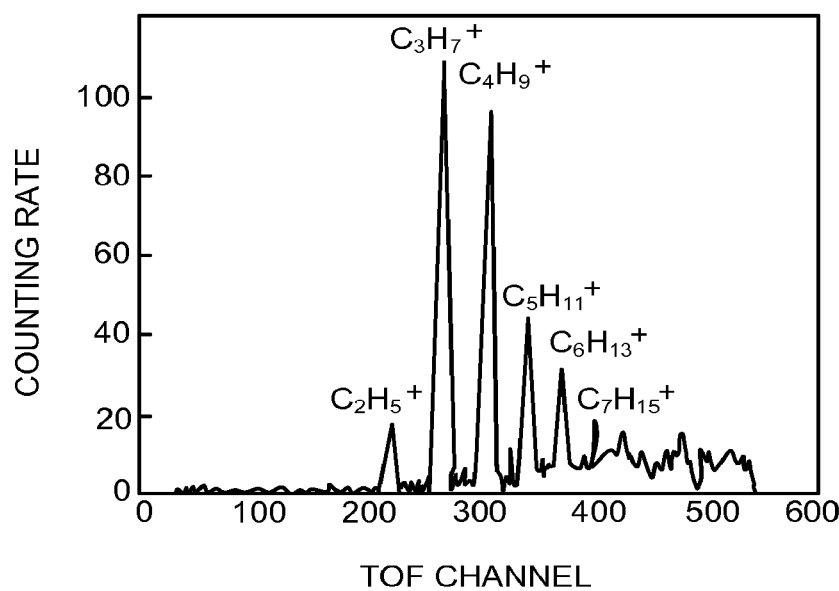
FIG. 28B is a graphical representation illustrating a TOF spectrum for decane produced by positron kinetic energy of 0.5 eV, which is below the positronium formation threshold for decane.

FIG. 28A illustrates a TOF spectrum for decane produced by positron kinetic energy of 4.3 eV, which is above the positronium formation threshold for decane, and FIG. 28A illustrates a TOF spectrum for decane produced by positron kinetic energy of 0.5 eV, which is below the positronium formation threshold for decane, as described in Hulett Jr, L. D., et al., Mass spectrometry studies of the ionization of organic molecules by low-energy positrons. Chemical Physics Letters, 1993. 216(1-2): pp. 236-240.

All references, patents and patent publications that are recited in this application are incorporated in their entirety herein by reference.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like. A computer remote from an analyzer can be linked to the analyzer over a wired or wireless network to enable data exchange between the analyzer and the remote computer (e.g. receiving data at the remote computer from the analyzer and transmitting information such as calibration data, operating parameters, software upgrades or updates, and the like) as well as remote control, diagnostics, etc. of the analyzer.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An imaging system for analyzing specimens, the imaging system comprising:
   a chamber having a controlled gas atmosphere maintained therein, the chamber being configured to receive a specimen;
   a detector;
   an energy applying component; and
   a controller configured to cause the energy applying component to selectively apply energy to the specimen disposed in the chamber having the controlled gas atmosphere such that the detector provides a first image of the specimen acquired in a first, non-destructive imaging mode of the imaging system, and a second image of the specimen acquired in a second, destructive imaging mode of the imaging system, wherein
   the first and second images are alternately acquired while the controlled gas atmosphere is maintained in the chamber, and
   the controller further configured to cause, after the first image is acquired and before the second image is acquired, the energy applying component to apply energy to the specimen to cause gas atoms adsorbed on the specimen to desorb without being ionized.

2. The imaging system of claim 1, wherein the first, non-destructive imaging mode comprises applying energy to the specimen to ionize a plurality of atoms of an imaging gas included in the controlled gas atmosphere, the plurality of atoms being used by the detector to provide the first image.

3. The imaging system of claim 1, wherein the second, destructive imaging mode comprises applying energy to the specimen to evaporate at least one specimen atom from a surface of the specimen, the at least one evaporated specimen atom being used by the detector to provide the second image.

4. The imaging system of claim 1, wherein the first, non-destructive imaging mode comprises a field ionization imaging mode.

5. The imaging system of claim 1, wherein the first, non-destructive imaging mode comprises a scanning electron microscope mode.

6. The imaging system of claim 1, wherein the second, destructive imaging mode comprises a field evaporation imaging mode.

7. The imaging system of claim 1, wherein the detector comprises first and second detectors, the first detector being configured to provide the first image acquired in the first, non-destructive imaging mode, and the second detector being configured to provide the second image acquired in the second, destructive imaging mode.

8. The imaging system of claim 7, wherein the first detector is configured to determine a three-dimensional position of at least one atom of the specimen being analyzed, and the second detector is configured to identify the at least one atom.

9. The imaging system of claim 2, wherein in the first, non-destructive imaging mode, the controller causes the energy applying component to apply energy to the specimen at time intervals that are greater than a rate of adsorption of atoms of the imaging gas to a surface of the specimen.

10. The imaging system of claim 2, wherein in the second, destructive imaging mode, the controller causes the energy applying component to apply energy to the specimen at time intervals that are less than a rate of adsorption of atoms of the imaging gas to a surface of the specimen.

11. The imaging system of claim 1, wherein the energy applying component is selected from the group consisting of a DC voltage source, an electrode, a laser source, and a positron source.

12. The imaging system of claim 1, wherein the specimen comprises at least one metal, at least one non-metal, a combination of metal and non-metal, or a biological sample.

13. The imaging system of claim 1, comprising a time of flight mass spectrometry detector configured to provide the second image of the specimen that is used to identify at least one atom of the specimen being analyzed.

14. The imaging system of claim 1, comprising a data processing and feature recognition system configured to combine information from the first and second images to determine a position and identity of at least one atom of the specimen.

15. The imaging system of claim 1, wherein the controller is configured to adjust parameters used in connection with causing the energy applying component to selectively apply energy to the specimen in the first, non-destructive and in the second, destructive imaging modes in response to measurements of at least one of current conditions of the specimen and current conditions of imaging environment.

* * * * *